United States Patent [19]

Sydney Smith et al.

[11] Patent Number: 6,127,824
[45] Date of Patent: Oct. 3, 2000

[54] NUCLEAR QUADRUPOLE RESONANCE TESTING

[75] Inventors: John Alec Sydney Smith, London; Neil Francis Peirson, Northampton, both of United Kingdom

[73] Assignee: BTG International Limited, London, United Kingdom

[21] Appl. No.: 09/258,125

[22] Filed: Feb. 26, 1999

Related U.S. Application Data

[63] Continuation of application No. PCT/GB97/02321, Aug. 28, 1997.

[30] Foreign Application Priority Data

Aug. 28, 1996 [GB] United Kingdom .................. 9617978
Aug. 28, 1997 [WO] WIPO ...................... PCT/GB97/02321

[51] Int. Cl.$^7$ ....................................................... G01V 3/00
[52] U.S. Cl. ............................................................ 324/300
[58] Field of Search .................................. 324/300, 312, 324/314, 307, 309

[56] References Cited

U.S. PATENT DOCUMENTS

| | | | |
|---|---|---|---|
| 5,365,171 | 11/1994 | Buess et al. | 324/307 |
| 5,521,504 | 5/1996 | Cory et al. | 324/309 |
| 5,608,321 | 3/1997 | Garroway et al. | |
| 5,804,967 | 9/1998 | Miller et al. | 324/314 |
| 5,814,987 | 9/1998 | Smith et al. | 324/300 |

FOREIGN PATENT DOCUMENTS

| | | |
|---|---|---|
| 2 282 666 | 4/1995 | United Kingdom . |
| WO 96/26453 | 8/1996 | WIPO . |

OTHER PUBLICATIONS

A Handbook of Nuclear Magnetic Resonance 1987, pp. 207–215, R Freeman, "Selective Excitation".

Z Naturforschung 1990, vol. 45a, pp. 581–586, A Ramamoorthy et al., "Numerical Design of Composite Pulses for Polycrystalline Samples in Pulsed NQR Spectroscopy".

Molecular Physics 1994, vol. 83 N$^\circ$2, pp. 193–210, S Z Ageev et al., "Composite pulses in nuclear quadrupole resonance".

J. of Magnetic Resonance 1993, vol. 104, pp. 203–208, N Sunitha Bai et al., "Numerical Design of Composite Excitation Pulses for NQR Spectroscopy".

Chemical Physics Letters, vol. 202 N$^\circ$1,2, pp. 82–86, Geng–Ying Li et al., Composite pulse excitation for spin–1 pure nuclear quadrupole resonance spectroscopy in powders.

European Convention on Security and Detection, Conference Publication 1995, pp. 288–292, J A Smith, "Nitrogen–14 Quadrupole Resonance Detection of RDX and HMX Based Explosives".

J. of Magnetic Resonance 1994, vol. 107, pp. 8–13, N. Reddy et al., Application of Extended–Time–Excitation Technique to NQR Spectroscopy. An Experimental Investigation of Zeeman–Perturbed Spin–Echo–Envelope Modulation.

(List continued on next page.)

*Primary Examiner*—Louis Arana
*Attorney, Agent, or Firm*—Nixon & Vanderhye

[57] ABSTRACT

Methods of testing a sample in which long composite pulses comprising a sequence of short closely spaced pulse elements are disclosed. The pulses generate a qualitatively different response characteristic, which can be tailored as desired by suitable adjustment of the pulses. Near sinusoidal dependence on pulse length can be attained, and effective, efficient, inversion pulses can be produced. Typically each pulse element generates a small flip angle of a few degrees, and the sequence conatins tens or even hundreds of elements. Similar excitation and effects may be produced by amplitude modulating a carrier, rather than switching pulses on and off; there is little discernible difference in the excitation seen by the sample.

32 Claims, 23 Drawing Sheets

OTHER PUBLICATIONS

Letters to the J. of Experimental & Theoretical Physics 1991, vol. 54 Issue 8, pp. 464–466, V L Ermakov et al., "Echo in the Effective Field of a Multi–Pulse NQR–Sequence".

J. of Molecular Strucuture 1989, vol. 192, pp. 333–344, A Ramamoorthy et al., "Design of Composite Pulses for Nuclear Quadrupole Resonance Spectroscopy".

Z Naturforschung 1992, vol. 47a, pp. 382–388, C Gonzales et al., "Two–dimensional Exchange Spectroscopy Using Pure NQR".

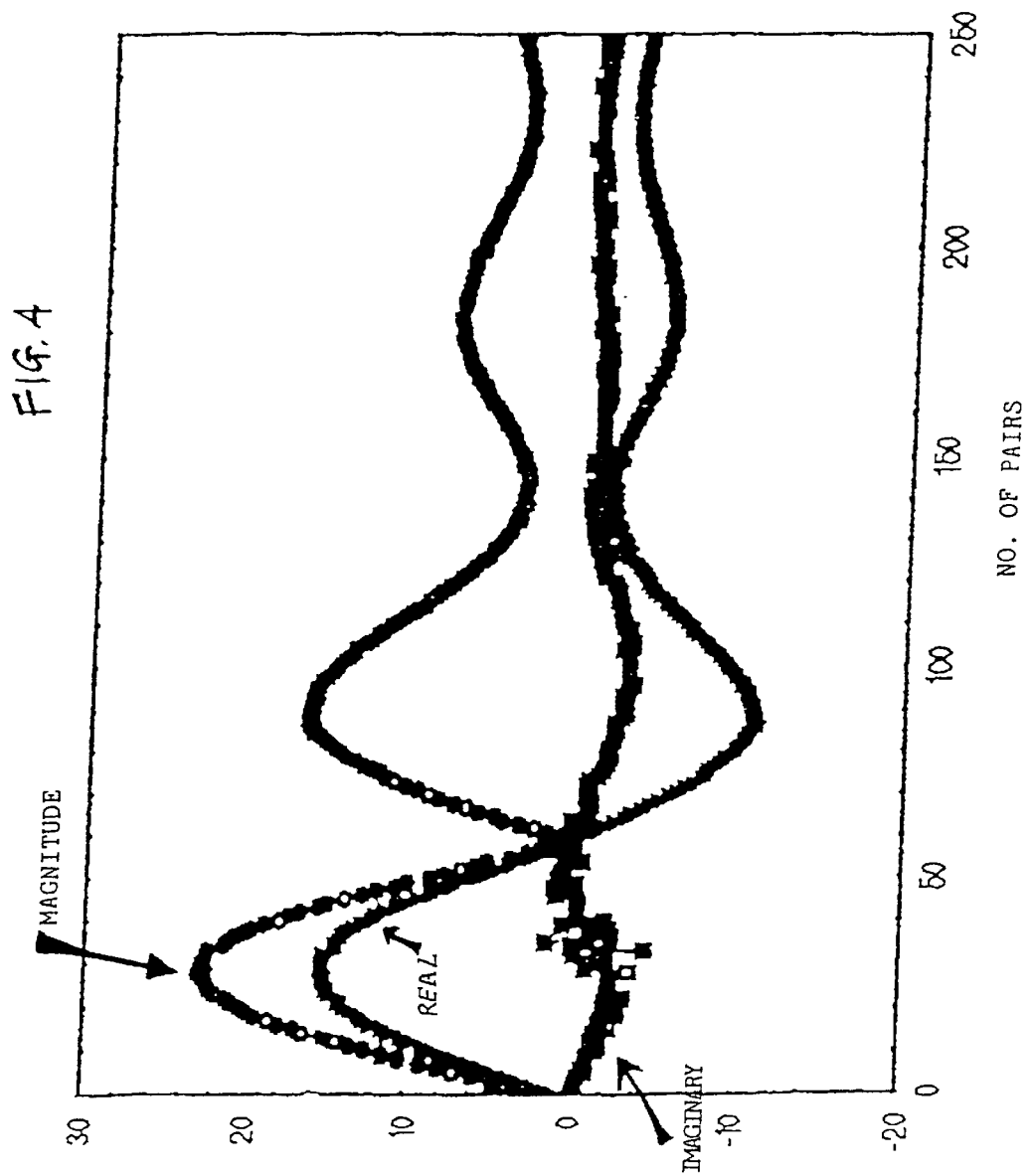

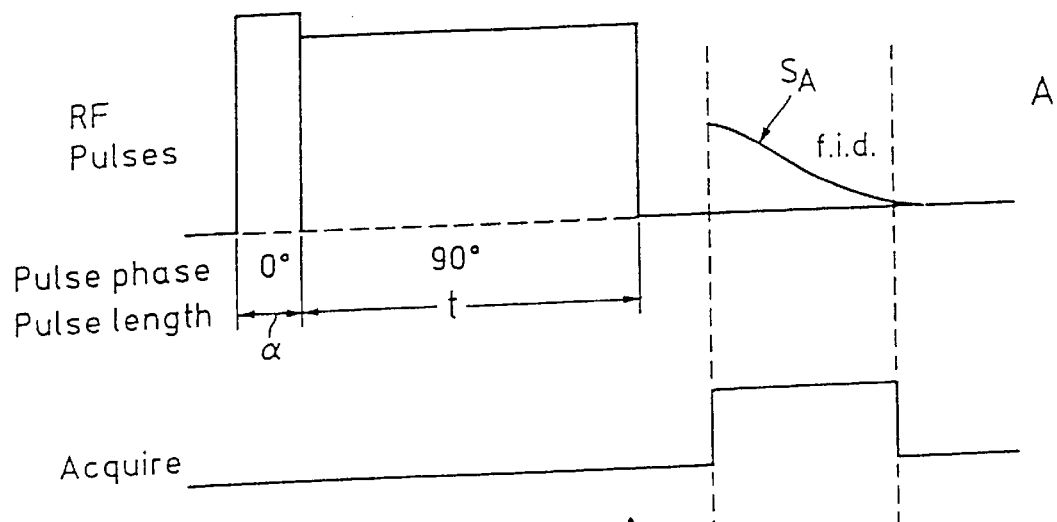
Fig. 17a(i)
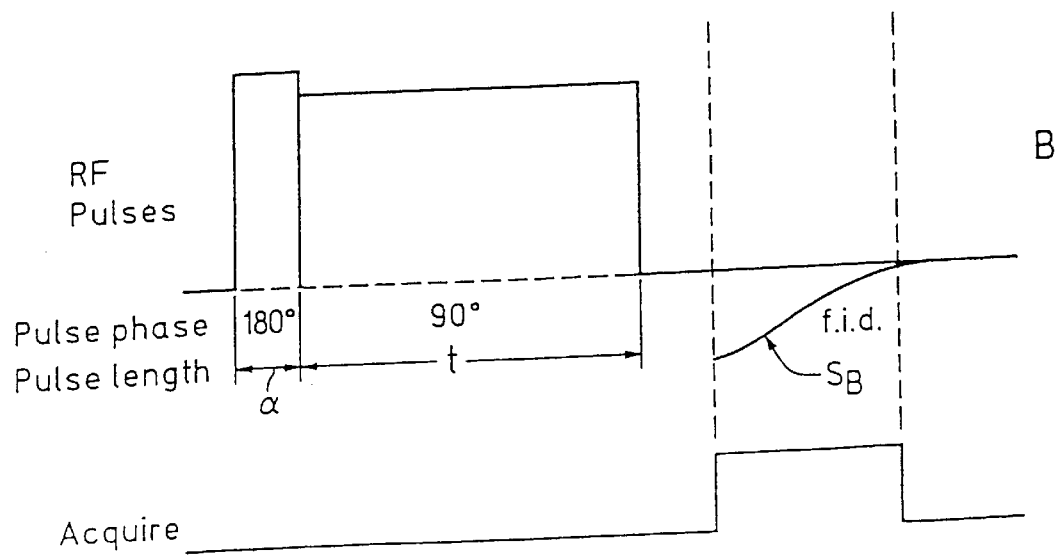
Fig. 17a(ii)

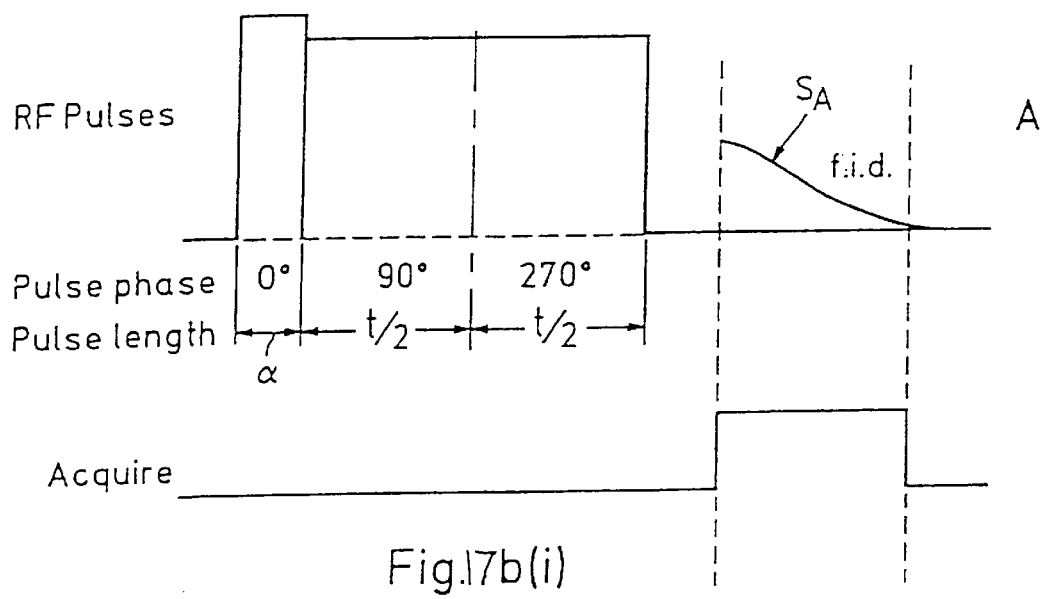
Fig.17b(i)
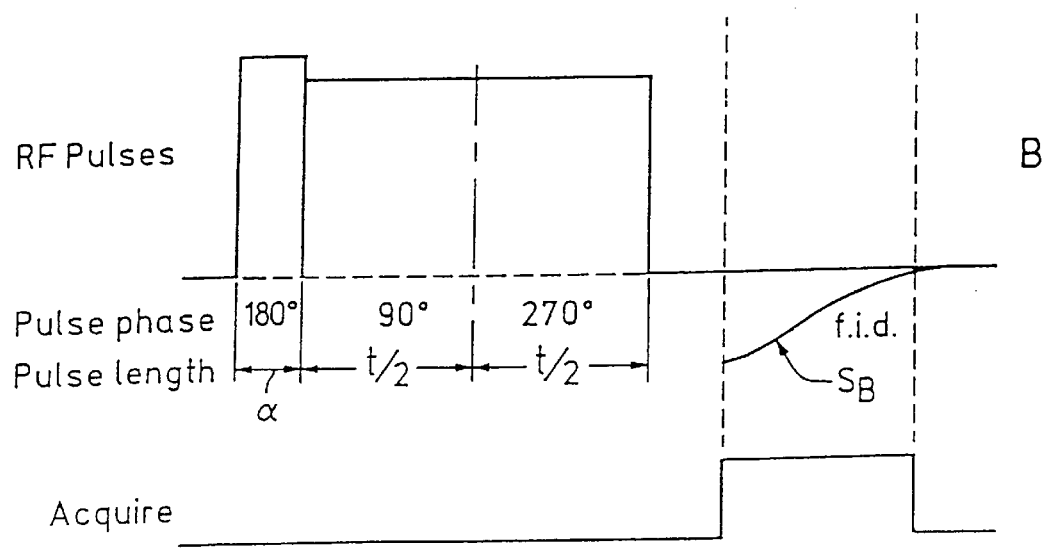
Fig.17b(ii)

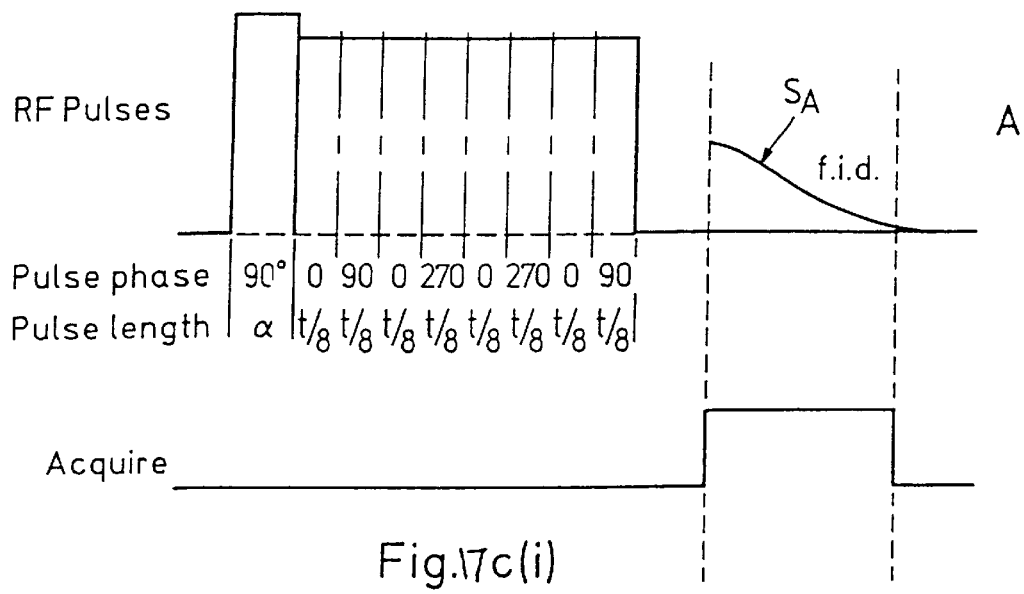
Fig.17c(i)
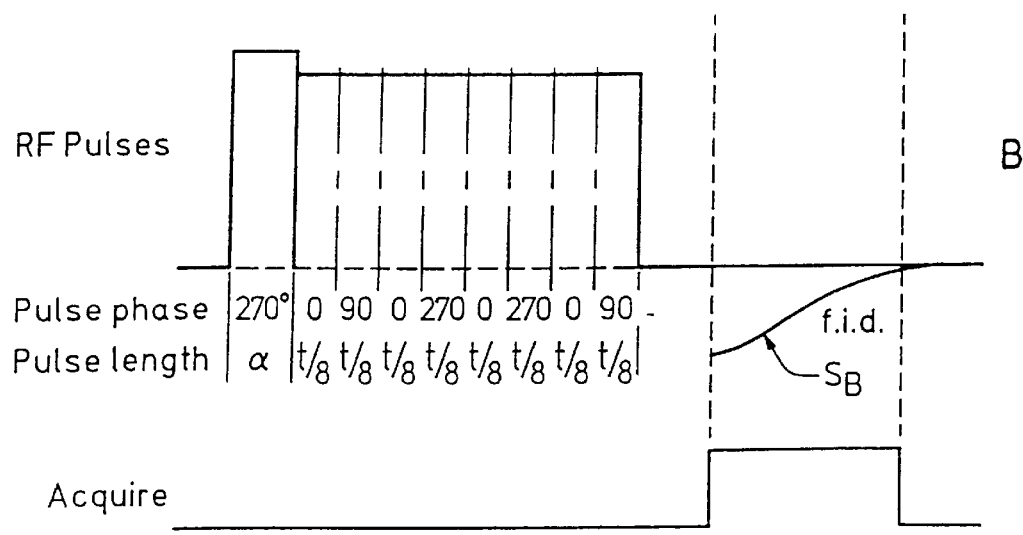
Fig.17c(ii)

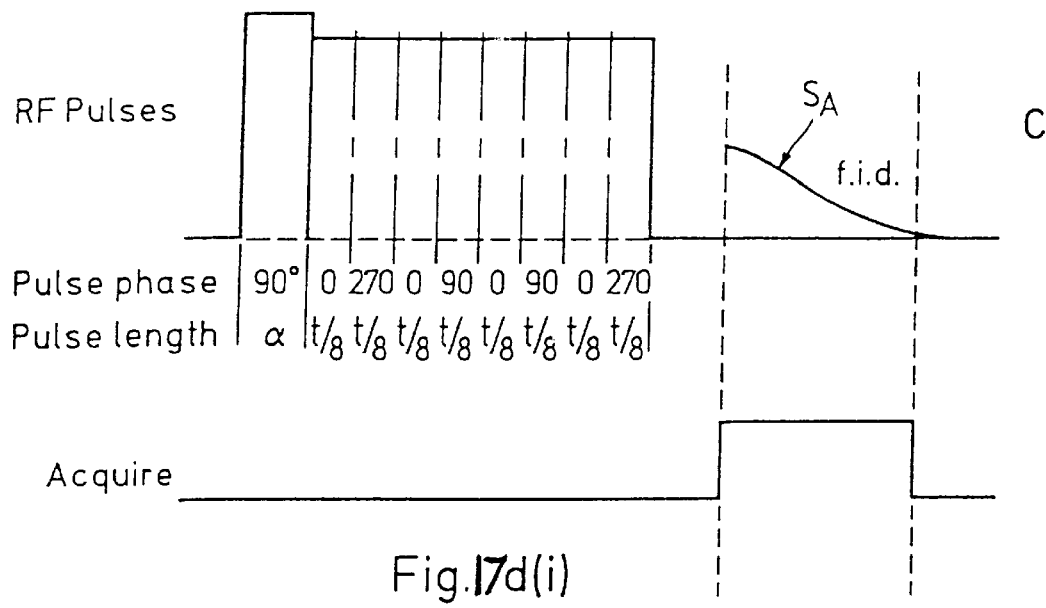
Fig.17d(i)
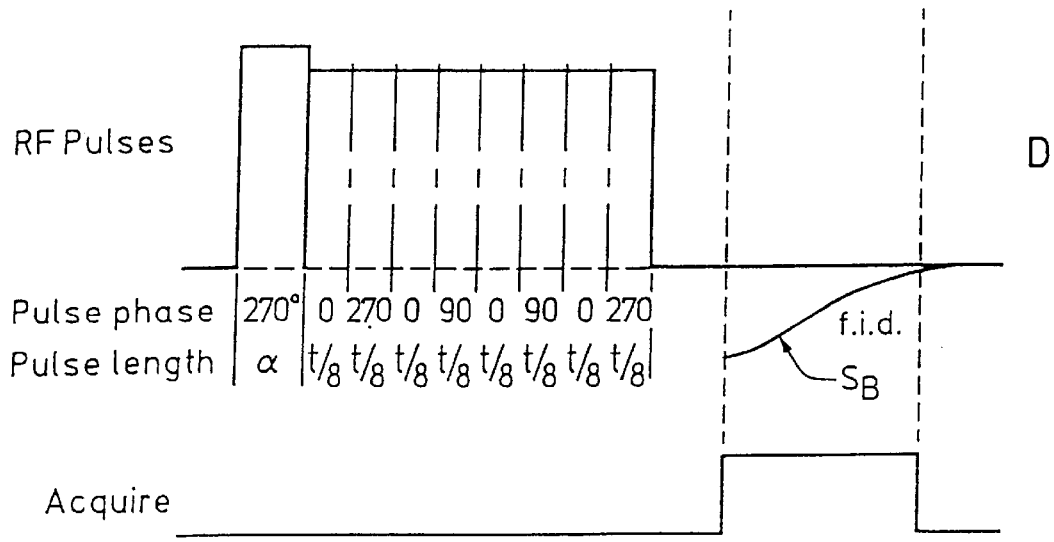
Fig.17d(ii)

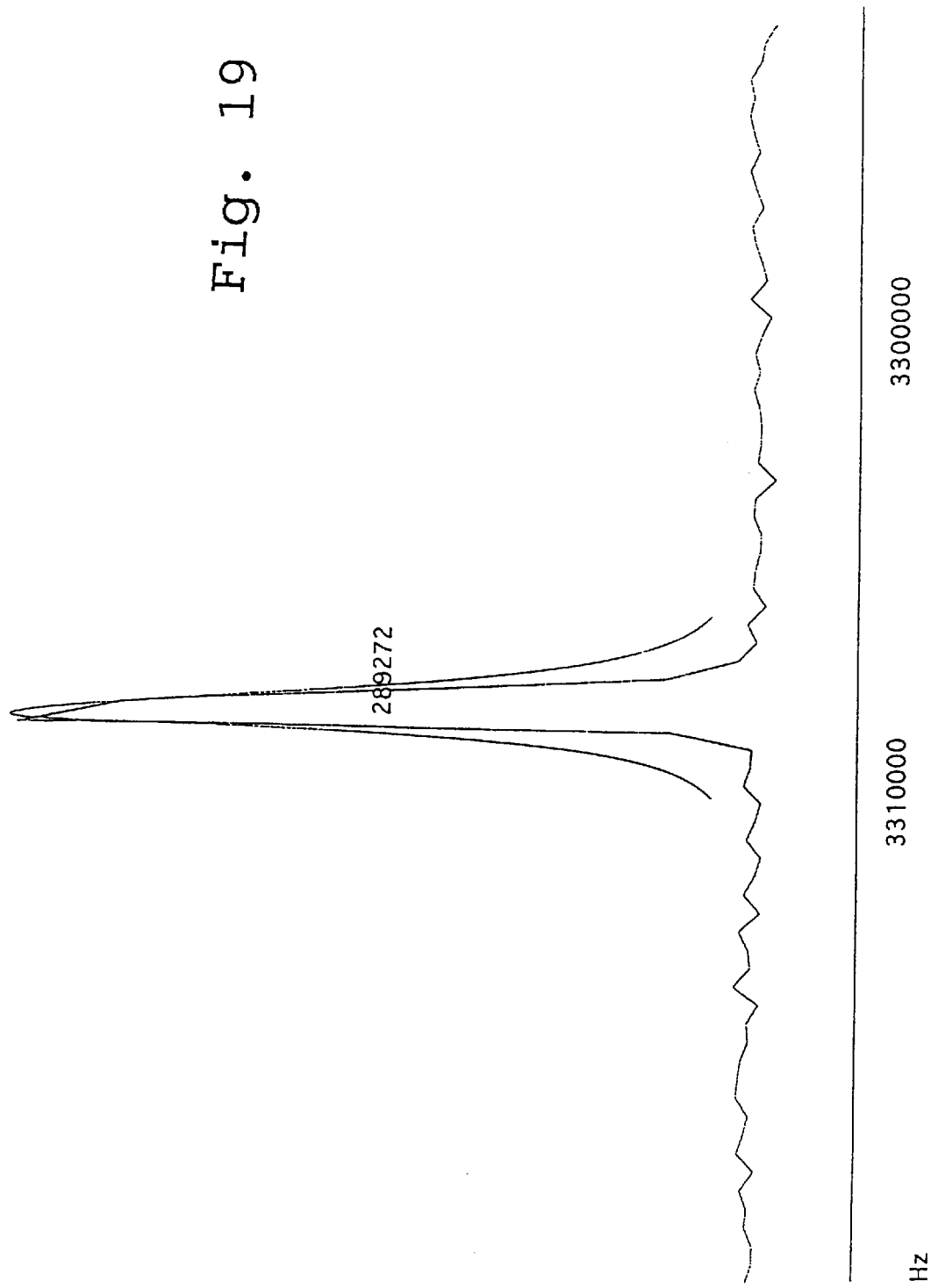

NUCLEAR QUADRUPOLE RESONANCE TESTING

This application is a continuation of PCT/GB97/02321 filed Aug. 28, 1997.

The present invention relates to a method of Nuclear Quadrupole Resonance (NQR) testing a sample.

BACKGROUND OF THE INVENTION

By way of background, Nuclear Magnetic Resonance (NMR) techniques have been widely used for testing samples. However NMR techniques generally require strong homogeneous magnetic fields to operate, and this adds to the cost and bulk of the equipment required.

NQR testing has been increasingly widely used for detecting the presence or disposition of specific substances. The NQR phenomenon depends on transitions between energy levels of quadrupolar nuclei, which have a spin quantum number I greater than or equal to 1, of which $^{14}N$ is an example (I=1). $^{14}N$ nuclei are present in a wide range of substances, including animal tissue, bone, food stuffs, explosives and drugs. The basic techniques of NQR testing are well-known and are discussed in numerous references and journals, so will only be mentioned briefly.

In conventional Nuclear Quadrupole Resonance testing a sample is placed within or near to a radio-frequency (r.f.) coil and is irradiated with pulses or sequences of pulses of electro-magnetic radiation having a frequency which is at or very close to a resonance frequency of the quadrupolar nuclei in a substance which is to be detected. If the substance is present, the irradiant energy will generate an oscillating magnetization which can induce voltage signals in a coil surrounding or close to the sample at the resonance frequency or frequencies and which can hence be detected as a free induction decay (f.i.d.) during a decay period after each pulse or as an echo after two or more pulses. These signals decay at a rate which depends on the time constants $T_2^*$ for the f.i.d., $T_2$ and $T_{2e}$ for the echo amplitude as a function of pulse separation, and $T_1$ for the recovery of the original signal after the conclusion of the pulse or pulse sequence.

A problem initially encountered in NQR techniques was that response signals were often not as easy to process as NMR response signals. In particular, NMR response signals generally exhibit a sinusoidal dependence on flip angle (which is in turn dependent on excitation pulse amplitude and duration); this facilitates processing and combination of signals excited under different conditions. In particular, the observed signal should be exactly inverted after a flip angle of 180°, and returned to its initial value after a further 180°. In contrast, NQR signals had been found to exhibit Bessel function dependencies (the order of the Bessel function depending on the nuclei) on flip angle, so that the relationship between detected signal and flip angle, and in particular between signals produced under differing conditions is less straightforward.

In addition, the precession of magnetisation in NMR (as opposed to the transverse oscillation of magnetisation in NQR) allows other useful techniques to be employed, an example of which is the so-called DANTE technique in which a sequence of short pulses separated by short periods of free precession are employed for fine tuning of resonance frequency. This technique, described on pages 207–215 of "A Handbook of Nuclear Magnetic Resonance" by R. Freeman (Longman 1987) is explained in terms of precession based on the rotating frame model, which is conventionally considered inapplicable to NQR.

A number of techniques have been developed to improve measurement of an NQR response. For example, Ramamoorthy et al. (Z. Naturforsch. 45a, 581–586, 1990) have proposed a composite pulse sequence comprising two or three pulse components for compensating inhomogeneity. That disclosure, which recognises that NMR techniques cannot be directly applied to NQR investigations (see particularly page 582, left-hand column), states that "Unlike NMR, it is not feasible to use a large number of pulses within a composite pulse in NQR." The treatment is limited to at most three pulses of carefully chosen phase and duration. A similar proposal has been made by Ageev et al. (Molecular Physics, 1994, Vol. 83, No. 2, 193–210), which also deals with three-component pulses, and affirms the view that "long pulse sequences are not desirable for NQR" (see page 193, second paragraph).

The cancellation of noise and spurious signals has been identified as an important issue in NQR; in this regard, U.S. Pat. No. 5,365,171 (Buess et al.) recognises the problem that "the cancellation techniques conventionally used for NMR are not directly applicable to NQR" and "there is no RF pulse that inverts the entire NQR 'magnetisation'" (see particularly column 2). Hence, there have been numerous attempts to provide alternative methods of noise and spurious signal cancellation in NQR; Buess discloses a method of reducing spurious NQR signals in which a pair of sequences of spaced apart (by approximately 1 millisecond) pulses is employed, one member of the pair being of alternating phase the other being of the same phase. Data sampled between each pulse are processed.

Composite pulse sequences comprising up between 3 and 8 mutually different pulse elements have been used to excite broadband resonance, as discussed in J. Mag. Res. A 104, 203–208 (1993). 8 pulse composite sequences are also disclosed in Chem. Phys. Lett. 202, 82–86 (1993).

The applicant's International Patent Application Number WO 96/26453, unpublished at the priority date of this application, discloses a number of phase cycling techniques and pulse sequences which have been found to give particularly good results in eliminating spurious signals.

However, there is still room for improvement in the excitation and detection of NQR responses. Most notably, the efficient inversion of magnetisation which has been so useful in NMR has not been achieved in an NQR experiment. Moreover, as Buess (see above) states, full inversion has been considered impossible in NQR and so research has concentrated on alternative methods of spurious signal cancellation.

SUMMARY OF THE INVENTION

In one aspect, the present invention provides a method of NQR testing a sample (for example containing or suspected of containing quadrupolar nuclei), the method comprising applying excitation to the sample to excite an NQR response signal, the excitation including a composite pulse comprising at least 10 closely spaced pulse elements, and detecting an NQR response signal (from the quadrupolar nuclei if present) after application of the composite pulse.

As used herein, the term "composite pulse" connotes a series of closely spaced pulses, the individual pulses being referred to as "pulse elements". Advantageously, the pulse elements are not all mutually different; instead, the sequence preferably comprises a plurality of pulses of substantially equal phase and effective flip angle (duration, intensity), interleaved with other pulses, the other pulses preferably also being composed of at least a sub-set of pulses of mutually similar phase and effective flip angle. Thus, for example, a sequence may comprise tens or hundreds of pulse elements, but there may only be a few (for example 2, 3, 4, 5, 6 or typically at most about 10) mutually distinct pulse elements, each of which is repeated a number of times.

Surprisingly, it has been found that using a large number of relatively short closely spaced pulse elements can change the response behaviour of a sample. In particular, it has been observed that the dependence on flip angle of the response signal may become sinusoidal, at least to a directly usable degree of approximation. Thus, the invention can give rise to a surprising, qualitatively different effect to that previously observed in NQR spectroscopy when a larger number of pulse elements is used. Pursuant to the invention, it has been appreciated that this sinusoidal dependence can render a number of techniques previously available only in NMR investigations applicable to NQR testing. It is also possible (within constraints) to adjust this dependence to achieve other desired dependence relationships (for example more linear). This change in response behaviour was not predictable from theoretical consideration and at present the reasons for it are not fully understood. Without limiting the scope of the invention to any particular theory, it may be helpful to consider the response to be the result of superposition of a large number of closely spaced echoes.

This surprising change in response characteristic can simplify processing of acquired data, as a large number of well-known NMR phase cycling, processing, noise cancellation and image reconstruction techniques are now made available in NQR experiments. One particularly desirable advantage this may provide is the ability to generate inversion of magnetisation with high efficiency, near 100% in some cases, as compared to efficiencies of about 40% previously attainable. In fact, the "efficiency", measured in terms of the NQR signal detectable after the inversion pulse divided by that detectable before the pulse (under similar conditions, for example using a single excitation pulse of flip angle 90°) may even be greater than 100%, as the signal attainable after inversion may be slightly greater than that attainable before inversion. Another advantage is that the r.f. power required to excite resonance of a given strength can be reduced. This can allow response signals with higher signal to noise ratios to be excited at lower field strengths; this may be particularly useful when probing sensitive biological samples or devices which contain sensitive electronic circuitry.

As used herein, the term "closely spaced" connotes a space (herein preferably defined as a reduction in the strength of excitation, and in some cases preferably a substantial absence of excitation) of duration less than the free induction decay (f.i.d.) time ($T_2^*$), preferably less than $0.1T_2^*$ or $0.01T_2^*$. For typical substances, for example having $T_2^*$ in the range of about 0.5–2 ms and $T_2$ in the range of about 5–20 ms, the spaces between consecutive pulse elements (which need not be equal throughout the composite pulse) are typcially less than 500, 100 or 50 $\mu$s and preferably less than about 20 or 10 $\mu$s, more preferably less than about 5 $\mu$s, and still more preferably between about 0.25 or 0.5 and 2.5 or about 1–2 $\mu$s. Spaces longer than about 5 or 10 $\mu$s may lead to loss of signal and will lengthen measurement times with little benefit in most cases. Conversely, in some circumstances, generation of very short spaces may cause problems with the equipment used to generate the pulses and may reduce the desired effect. However, the space may be as little as 0.1 $\mu$s, and in particular if the pulse elements differ in phase, the elements may be substantially contiguous (that is there may be no or substantially no discernable "space" between pulse elements; the spacing may be zero).

"Closely spaced" also preferably implies that the response signal is not detected between pulse elements. Of course, the receiver or detection circuitry may be physically capable of receiving signals between pulse elements, and references to the response signal not being detected are not intended to exclude this possibility, but are intended to imply that any signals received do not substantially affect any processing performed on the signal as detected after the composite pulse is completed. For example, if the response signal is digitised or otherwise sampled, sampling may start after all pulses in a composite pulse have been transmitted, or any data acquired before transmission of all pulse elements may be discarded.

The duration of each pulse element (which may vary from element to element) is preferably short, preferably less than $T_2^*$ or $0.1 T_2^*$ but preferably (in most cases) longer than the spaces, for example preferably less than about 100, 50, 20 or 10 $\mu$s, more preferably less than 5 $\mu$s, and most preferably between about 0.25 or 0.5 and 2.5 or about 1–2 $\mu$s.

Preferably, the ratio of pulse element durations to spaces is at least 0.5 and preferably greater than 1, more preferably less than 100 or 50, and desirably in the range 1 to 10.

If the pulse elements are very short, then the signal diminishes. In addition, the excitation may become ill-defined; a 1 $\mu$s pulse at a measurement frequency of approximately 5 MHz contains only 5 cycles. Preferably, each pulse element contains at least 2, and more preferably at least 5 cycles, of the excitation carrier frequency.

On the other hand, if the pulse elements are long, then fewer pulse elements can be included for a given total flip angle and field strength, and the response may approach that excited by a single pulse. Thus, preferably each pulse element contains less than 500, more preferably less than 100, and still more preferably less than about 50 cycles of carrier frequency. These limits are appropriate for carrier frequencies of the order of a few MHz and f.i.d. times of the order of a few milliseconds; for substances widely outside these ranges, other limits may be chosen.

Preferably, the effective flip angle produced by each pulse element is small, preferably less than 10 degrees, more preferably less than 5°, still more preferably less than 2, 1 or 0.5°. It has been found pursuant to the present invention that the smaller the flip angle of each individual pulse element (and the greater the number of pulse elements in a composite pulse), the more pronounced is the change in response behaviour as described above.

Although precise measurement of flip angles is not critical, in this specification the flip angle of a pulse is defined (in degrees) according to the following formula:

$$\text{Flip angle} = 119 * (B_1 \cdot T)_x / (B_1 \cdot T)_{119}$$

where $(B_1 \cdot T)_x$ is the product (or integral) of field and duration of the pulse, and $(B_1 \cdot T)_{119}$ is the product of field and duration of a single rectangular pulse which produces a 119 degree actual flip angle (determined by observation of a signal maximum).

In practice, the composite pulses will generally be formed by switching a carrier on or off, and often also by switching between two or more sources of carrier of different phases. Thus the pulses will typically be considered herein as discrete pulses (typically having a rectangular envelope) separated by spaces. However, the magnetisation produced by an r.f. coil fed with such a pulse sequence will not rise immediately to a fixed value during a pulse element nor drop immediately to zero during a space. Instead, there will be a gradual rise and decay, which will depend on (among other factors including the amplifier circuitry) the Q factor or ratio of inductance to resistance of the coil. The excitation waveform is likely to vary from point to point in the apparatus; at the output of the gate which switches the pulses, the spaces and pulses elements may be much better defined than in the signal measured by a probe coil, where the distinction being spaces and pulse elements may be much less discernable. Thus the $B_1$ field seen by the sample will effectively be an amplitude modulated (and phase modulated, if successive pulses vary in phase) carrier. For low Q factors and relatively long switching times, the amplitude modulation function will generally approximate a rectangular wave (typically with a mark-space ratio greater than 1); the depth of modulation will approach 100% when the switching on and off is "clean" and the Q factor is low. However, the sides of the "square" will generally become more exponential or sinusoidal as the Q factor increases or as the bandwidth of the equipment is reached, and in practice, with Q factors of 50 or more, and cycle times of a few microseconds at a few MHz; the excitation seen by the sample will comprise a substantially carrier, with regions of increased amplitude corresponding to pulse elements, and regions of decreased amplitude corresponding to spaces.

An alternative method of producing the composite pulse is to use an amplitude modulator (and, if required, phase modulator or combined amplitude/phase modulator).

Thus, according to a second aspect of the invention, there is provided a method of NQR testing a sample (containing or suspected of containing quadrupolar nuclei), the method comprising applying excitation to the sample to excite an NQR response signal, the excitation comprising a composite pulse having an amplitude modulated carrier, and detecting the NQR response signal (from the quadrupolar nuclei if present) after application of the composite pulse.

The depth of modulation may be as low as 10%, 20% or 30% (or even less). However, preferably the carrier is modulated to a depth of at least 50%, more preferably 75%, 90% or approximately 100%. Greater modulation depths may produce a more pronounced effect as described above.

Preferably the modulated carrier has an envelope defining a series of periods of relatively low amplitude, preferably less than 50%, 25% or 10% of the maximum amplitude of the envelope, (to be considered as defining the "spaces" of the first aspect) interleaved with a series of (preferably at least 10) mark periods of relatively high amplitude, preferably at least 50%, 60% or 80% of said maximum amplitude, (to be considered as defining the "pulse elements" of the first aspect). In some embodiments it is desirable for the amplitude to remain substantially constant (for example to within 10 or 20% of the maximum amplitude) during each space or mark period.

Preferably the peak amplitude (during a pulse element) is at least double, five time or ten times (or more) the minimum amplitude (during a space).

Preferably the envelope changes (preferably smoothly) between said mark and space periods during transition periods of duration substantially shorter than either of said mark or space periods. This can allow the individual pulse elements to be better defined. However, the transitions may deliberately be smoothed, or in other words the pulse elements may be shaped for example to reduce the generation of unwanted signals by rapid transitions, or to optimise the excitation to a given application. In particular, the modulation may be selected to produce a desired frequency spectrum (for example by defining a shape in the frequency-domain of the fourier transform using the principles described in the applicant's earlier United Kingdom patent application GB-A-2,282,666). The envelope may vary throughout the composite pulse, so that the amplitudes of successive pulse elements vary.

The period from an amplitude maximum, through the first succeeding minimum to the next maximum will be referred to as a cycle, the number of cycles corresponding to the number of pulse elements of the first aspect; preferably the composite pulse includes at least 10 or more cycles.

Whether the composite pulse is formed by amplitude modulation or by discrete switching, similar considerations apply to the pulse elements and spaces. For example, even when notionally discrete pulses are used, individual pulses may be shaped, or the envelope of the composite pulse may be adjusted.

Preferably, the composite pulse comprises at least 15, 20, 30, 50, 100, 200, 400 or more pulse elements (or cycles). It has been found that increasing the number of pulse elements tends to enhance the beneficial effects described below. Typically, when 30 or more pulse elements are used, inversion efficiencies of over 60% can be achieved, and with 100 or more pulse elements, efficiencies of 90% or more may be attained.

Preferably, the pulse elements are all of substantially equal duration. This is found to enhance the signal response. An exception is in some cases where non-sinusoidal dependence on flip angle is required.

In one preferred embodiment, the composite pulse is formed from a repeating pair of pulse elements (for example of different phases, but preferably substantially equal durations). A repeating triplet or even quadruplet or longer sub-sequence, (or even in some cases a non-repetitive sequence) may be used to adjust the response shape as desired.

In a preferred arrangement, the composite pulse comprises pulse elements of alternating first and second phases. Applying pulses of two different phases can enhance the change in response behaviour. Preferably all pulses of the first phase are substantially of a first duration and all pulses of the second phase are substantially of a second duration, and preferably the first and second durations are substantially equal.

Preferably, the first and second phases differ by about 90°. This is found to give particularly advantageous response signal behaviour in certain cases.

For example, the composite pulse may comprise a pulse element sequence of the following form:

$[P_0-Q_{90}=]_n$ or $[P_0-Q_{270}=]_n$ where P and Q are the (typically similar) flip angles produced by the first and second pulse elements, "–" and "="represent spaces (if present, which may be of the same or equal duration) and n is the number of repetitions or pairs of elements of the sequence, equal to half the total number of elements. The subscripted numbers represent the phase of each pulse element. Both phases can be offset by the same amount; this should not affect the shape of the response, only the phase at which a response is observed.

The composite pulses of the invention may be used in place of a single pulse, or in place of a conventional "composite" pulse (that is containing two or three contiguous elements). A composite pulse according to the invention (for example containing 10 or preferably more closely spaced pulses) will be referred to in the subsequent description as a long-composite pulse, to avoid confusion with a conventional (2 or 3 element) composite pulse. References to the flip angle of a long-composite pulse are intended to refer to the flip angle produced by the entire series of pulse elements (unless otherwise indicated). The phase of a long-composite pulse will be defined (where appropriate) as the equivalent phase of a single pulse which produces a similar effect; where all pulse elements in the composite pulse have the same phase, this may be equal to that phase. Where pulses have a fixed phase relationship to each other (for example alternating 0, 90° as discussed in the preceding paragraph) a phase offset may be added to all pulses to vary the effective phase of the long-composite pulse.

It is particularly preferred if a long-composite pulse is used to generate a flip angle in excess of 90°, in place of a single pulse. In particular, a long-composite pulse of flip angle 180° may be used to invert the magnetisation of a system of quadrupolar nuclei in between two or more sequential experiments. The invention, by providing an efficient inversion pulse, and also the quasi-sinusoidal dependence of the response signal magnitude on flip angle, can enable a wide variety of techniques previously only applicable in NMR investigations to be used in NQR experiments. NMR techniques are well-known, and modification of certain individual techniques for use in NQR employing the inversion pulses provided by the invention can now be straightforward in the light of the invention, so detailed discussion will not be presented here.

In general, subtraction of signals obtained from two similar experiments, one of which follows an inversion pulse, can result in cancellation of spurious signals while retaining genuine response signals. This may be particularly useful when conducting Pulse-Spin-Locking experiments on samples such as PETN which have a long spin-lattice relaxation time $T_1$; where previously if it was desired to subtract response signals, two separate experiments were required with perhaps several minutes for the magnetisation to recover between them, the second experiment can now be performed efficiently, substantially immediately after the first with an inversion pulse between them and the resulting data subtracted or otherwise compared.

In a third method aspect, the invention provides a method of Nuclear Quadrupole Resonance testing a sample, the method comprising applying to the sample a composite inversion pulse having a series of closely spaced pulse elements, the pulse (for example through its spacing, phase, amplitude, number and duration of the pulse elements) being arranged to effect inversion of at least 50 percent of the magnetisation detectable (for example by exciting the sample with a single pulse of nominal flip angle approximately 90°) on applying NQR excitation to the sample.

Preferably, 60, 70, 80, more preferably 90 or even about 100 percent of the signal is detectable following the composite inversion pulse. The provision of an inversion pulse which enables a high degree of signal recovery can enable a number of spurious signal cancellation techniques previously available only available in NMR to be used in NQR experiments.

The above mentioned considerations apply to this aspect of the present invention; for example, the pulse preferably contains at least 50, preferably at least 100 pulse elements; the duration of each pulse element is preferably at least about 1 µs; consecutive pulses are preferably separated by at least about 0.5 µs; preferably the phase of the pulse elements alternates between two phases, preferably differing by about 90°.

The method may further comprise applying excitation to the sample subsequent to the inversion pulse and detecting an NQR response signal. This signal can then be compared to or subtracted from (or added to) a signal obtained without an inversion pulse; this may cancel or assist in identification of spurious signals.

Hence, in a fourth aspect of the invention, there is provided a method of Nuclear Quadrupole Resonance testing a sample comprising applying a sequence comprising a first pulse of a first phase and at least one further pulse of a second phase, preferably differing from the first phase by about 90°; detecting a first NQR response signal; applying an inversion pulse (for example as provided above); re-applying said pulse sequence; detecting a second NQR response signal; and comparing the first and second response signals (for example by subtracting to produce a net NQR response signal). This may cancel spurious signals in the response. Preferably, the sequence is a pulse spin-locking sequence, comprising a series of regularly spaced further pulses, and a set of first NQR response signals is detected (for example one signal after each further pulse) when the sequence is first applied and a set of second NQR response signals is detected when the sequence is re-applied. Preferably, the spacing between each further pulse is substantially double the spacing between the first pulse and the first further pulse.

The first pulse of the sequence may be a single pulse or a long-composite pulse, as may the further pulse(s). Preferably the inversion pulse is a long-composite pulse (although a single pulse which provides limited signal recovery may be useful in some cases).

The sinusoidal dependence of the magnetisation achievable with the present invention can result in flip angles differing by 180° producing substantially equal but opposite signals and these may be used according to the present invention to cancel spurious signals in a method of NQR testing a sample comprising applying a first long-composite pulse as aforesaid to produce a first flip angle, preferably about 90°; detecting a first NQR response signal; applying a second long-composite pulse to produce a second flip angle, preferably about 270°, the difference between the first and second flip angles preferably being about 180°; detecting a second NQR response signal; and comprising (for example subtracting) the first and second response signals. Most preferably a plurality of said first and second pulses are applied; this can reduce noise and spurious signals.

Surprisingly it has been discovered pursuant to the present invention that a pair of long-composite pulses according to the invention can produce two "echoes" or signal maxima. This may be useful in distinguishing true NQR signals from spurious signals. Based on this, there is provided according to the present invention a method of Nuclear Quadrupole Resonance testing a sample comprising applying first and second long-composite pulses as aforesaid, the pulses being separated by a predetermined delay, and detecting a first maximum response within a time less than said delay following said second long-composite pulse or detecting a second maximum response at a time substantially equal to or greater than said delay following the second long-composite pulse.

A further advantage observed with the long-composite pulses is the ability to produce a prolonged response signal, for example lasting significantly longer than the normal f.i.d. time, and in some cases having an amplitude increasing after a delay; this may facilitate measurement after the dead-time of the apparatus. The prolonged response signal may be employed according to the present invention in a method of Nuclear Quadrupole Resonance Testing a sample comprising applying to a sample a long-composite excitation pulse and detecting an NQR response for a sampling period from a time following termination of the excitation pulse to a time at least equal to $T_2^*$ and preferably 2, 3, 4 or 5 or more times $T_2^*$ thereafter, the excitation pulse being arranged to produce a generally constant (that is generally within +/-20% or possibly +/-50% as compared to exponential decay) signal amplitude during said sampling period. The achievable advantage is particularly pronounced if a 270° flip angle composite pulse is used (instead of a 90° pulse).

Another achievable advantage (partly a result of the longer response signal produced) is the reduction of line width of the response spectrum which can improve the signal to noise ratio; this may render pharmaceuticals, proteins, and narcotics which have broad responses easier to detect. The reduction of like width is made use of in a method according to the present invention further comprising Fourier transforming an NQR response signal obtained following a long-composite pulse as aforesaid and identifying a peak corresponding to given quadrupolar nuclei.

The techniques discussed herein are believed (this explanation is not intended to limit the scope of the invention) to take advantage of, at least in part, the de-phasing of a response signal with time, which is conventionally observed as the inhomogeneous broadening of an NQR spectral line. The pulse sequences described tend to reduce the effect of this inhomogeneous broadening, so are useful for detecting impure substances. Conversely, the effects observed may be reduced for substances which exhibit little inhomogeneous broadening, for example very pure samples.

The techniques used may also give an indication of the degree of broadening, and this can give an indication of the environment of the nuclei, for example the stress to which they are subjected.

In a preferred embodiment, the invention provides a method comprising applying a long-composite pulse to the sample (for example in accordance with the first or second aspects) and determining a measure of inhomogeneous broadening of the response spectrum from the detected NQR response signal. Preferably, the measure is obtained by comparing the detected signal to the detected signal following a single pulse or at least one different long-composite pulse. The method may include producing an output representative of the environment (e.g. stress) of the quadrupolar nuclei in the sample.

The invention may also provide pulse sequences as used in the above methods, or as described below, and apparatus arranged to carry out the methods described. In addition, the pulse sequences described in the applicant's co-pending International Patent Application No. PCT/GB96/00422 may be employed using one or more long-composite pulses as aforesaid in place of one or more of the single pulses used in the sequences disclosed in that document.

It is important to note that the majority of discussion (above and below) herein concentrates on nuclei of spin I=1, such as $^{14}N$ for ease of understanding. The same basic techniques may be applied to produce similar results with quadrupolar nuclei of other spin quantum number, examples of which include $^{35}Cl$ (I=3/2) or $^{127}I$ (I=5/2). However it will be appreciated that identical results may not be achieved, and some adjustment of the detail of sequences described may be necessary, based on the principles discussed below. Observation of differences in "sinusoidal" behaviour between nuclei of different spin quantum number using pulses of the invention is related to the different Bessel functions applicable to nuclei of different spin quantum number using conventional pulses.

BRIEF DESCRIPTION OF THE DRAWINGS

Preferred features of the present invention will now be described, by way of example, with reference to the accompanying drawings, in which:

FIG. 4 shows the real and imaginary components of the waveform depicted in FIG. 2;

FIG. 17 depicts pulse sequences used in phase-cycling;

FIG. 19 shows both Lorentzian and near Gaussian line shapes observed in HMT.

DETAILED DESCRIPTION OF PREFERRED EMBODIMENTS

APPARATUS

Figure 1:
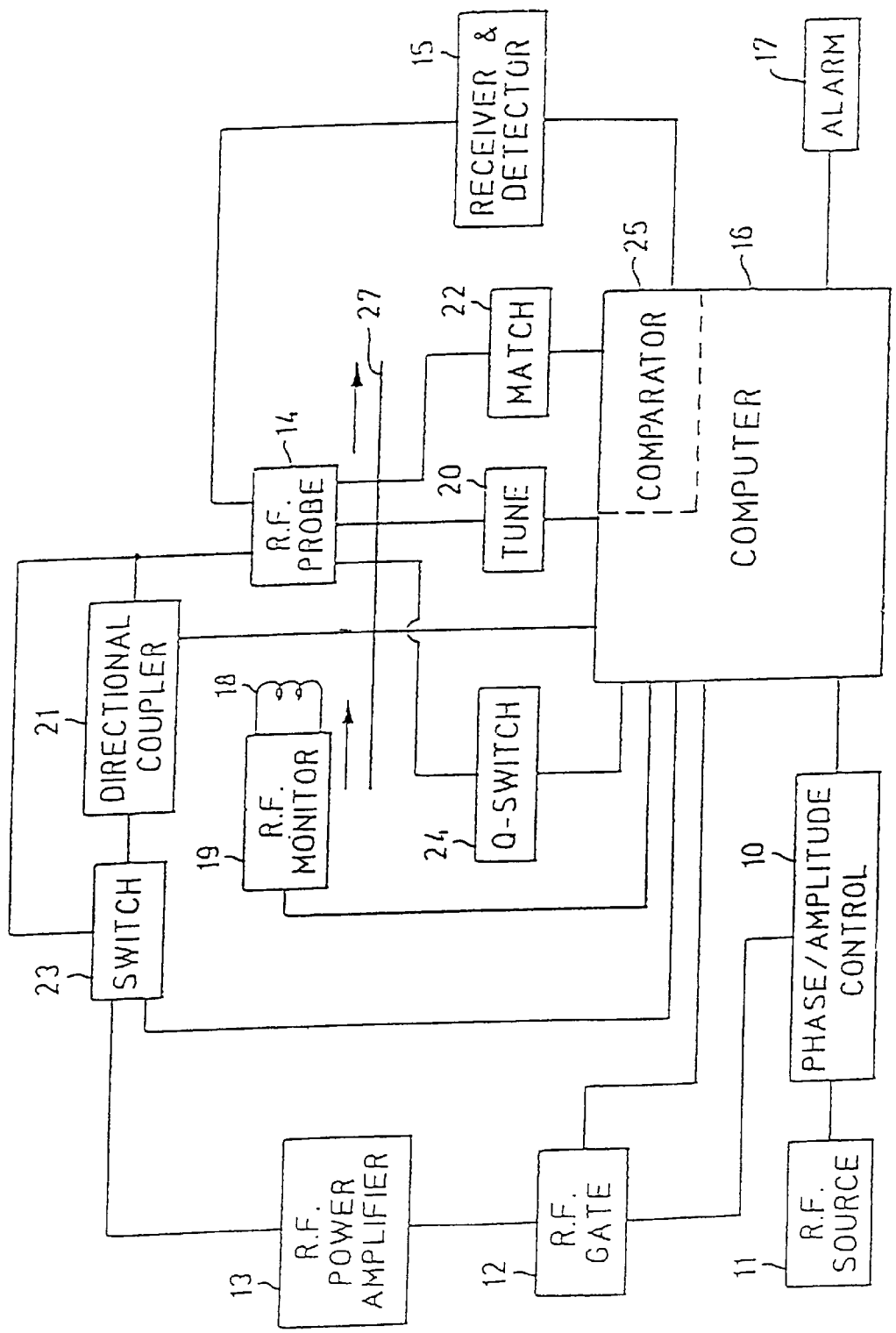
FIG. 1 is a block diagram of apparatus for NQR testing according to the present invention.

Referring first to FIG. 1, apparatus for NQR testing includes a radio-frequency source 11 connected via a phase/amplitude control 10 and a gate 12 to an r.f. power amplifier 13. The output of the latter is connected to an r.f. probe 14 which contains one or more r.f. coils disposed about or adjacent the sample to be tested (not shown), such that the sample can be irradiated with r.f. pulses at the appropriate frequency or frequencies to excite nuclear quadrupole resonance in the substance under test (for example, an explosive). The r.f. probe 14 is also connected to r.f. receiver and detection circuitry 15 for detecting nuclear quadrupole response signals. The detected signal is sent from circuitry 15 to a control computer 16 (or other control apparatus) for processing, and for signal addition or subtraction. The computer includes output means 17 such as a VDU or alarm for indicating the results of testing. For example, an alarm signal would normally be used to activate an audio or visual alarm to alert the operator to the presence of an explosive or narcotic in the substance under test.

The control computer 16 also controls all pulses, their radio frequency, time, length, amplitude and phase. In the context of the present invention all of these parameters may need to be adjusted precisely; for example, phase may need to be varied in order to be able to generate echo responses.

In particular, the computer controls switching of r.f. gate 12, which is capable of switching at a frequency of at least about 1 MHz, to generate the series of closely spaced short pulses required. In practice, the phase control function of phase/amplitude control 10 may be implemented by providing a series of signals of different phases (for example 0, 90, 180, 270°) from the r.f. source, for example using delays, and the r.f. gate may couple the appropriate one (or none for a space) to the input of the amplifier.

Re-tuning of the r.f. probe 14, alteration of its matching and alteration of its Q factor may all need to be carried out dependent upon the nature of the sample. These functions are carried out by the control computer 16 as follows. Firstly, the computer checks the tuning of the r.f. probe 14 by means of a pick-up coil 18 and r.f. monitor 19, making adjustments by means of the tuning control 20. Secondly, the matching to the r.f. power amplifier 13 is monitored by means of a directional coupler 21 (or directional wattmeter), which the computer responds to via a matching circuit 22, which in turn adjusts the r.f. probe 14 by means of a variable capacitance or inductance. The directional coupler 21 is switched out by the computer 16 when not required, via switch 23.

The control computer 16 may be programmed in various ways to implement the composite pulses described in this specification and to reduce or eliminate the spurious interference described above by controlling the pulse amplitudes and phases by means of the control 10.

As an alternative arrangement, the phase/amplitude control may be provided by an amplitude modulator, typically supplied with a synthesised modulating waveform from the control computer.

METHODS OF NQR TESTING ACCORDING TO THE PRESENT INVENTION

Sinusoidal response and inversion pulses: example

Figure 2:
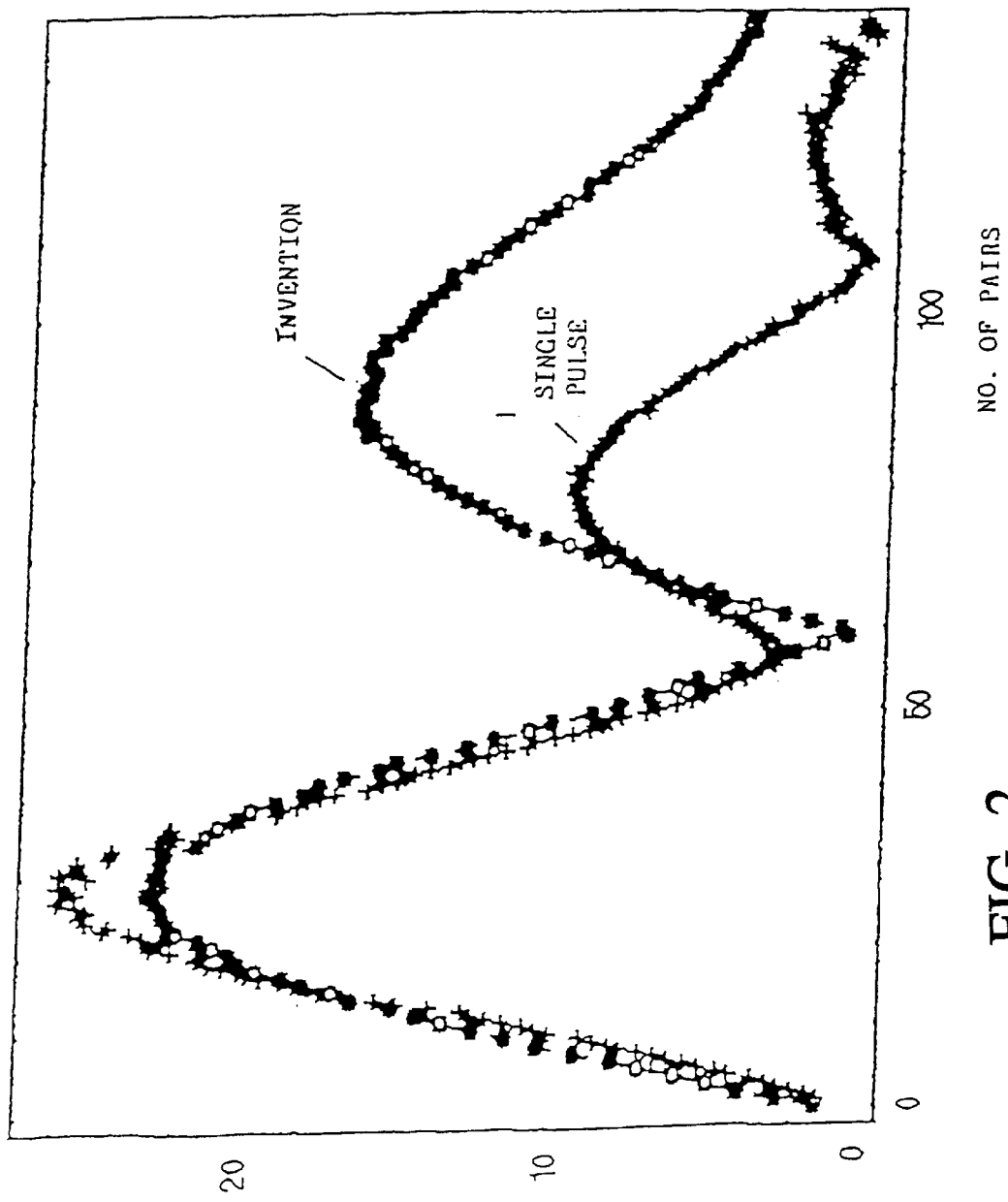
FIG. 2 shows the NQR response to a single pulse and to a long-composite pulse according to the invention.

An RDX sample containing $^{14}$N nuclei was excited with a conventional single pulse of frequency 3.41 MHz and amplitude 2 mT, and the detected signal magnitude as a function of pulse length is shown in FIG. 2, as the series of crosses, the units on the abscissa representing approximately 2 $\mu$s. As can be seen, the detected signal magnitude exhibits the well-known Bessel function behaviour, the magnitude of the first peak being about three times that of the second. It can also be seen that the minimum between the peaks does not drop entirely to zero. The line excited exhibits an f.i.d. characteristic time ($T_2^*$) of about 700 $\mu$s.

Next, the same sample was excited using a long-composite pulse according to the present invention, comprising a repeated sequence as follows:

[Pulse element: phase 0°, duration 2.0 $\mu$s
Space: duration 1.5 $\mu$s
Pulse element: phase 90°, duration 2.0 $\mu$s
Space: duration 2.0 $\mu$s] REPEAT Thus, in the above sequence, the total time for a pair of pulses and spaces is 7.5 $\mu$s of which the pulse is on for 4 $\mu$s. Note that the spaces between the pulses, although similar, are not exactly equal; this was chosen for convenience with the equipment used, and was found to give a good near sinusoidal dependence. However, small variations in the space durations did not make large differences in the shape of the response curve.

The open squares in FIG. 2 show the magnitude of the signal obtained as a function of the number of repetitions of the sequence. It was observed that the $B_1$ field transmitted was smaller than that produced in the above experiment, for the same amplitude signal. This is due to the time taken for the signal to rise to maximum amplitude, and is dependent on the amplifier and coil parameters as well as on the pulse duration, but for typical apparatus comprising a capacitively matched and tuned solenoid coil with a Q factor of the order of 80 and using a Kalmus 166 LPM 1000 W pulse amplifier of bandwidth approximately (1–40 MHz), the $B_1$ field was found to be approximately a third of that developed for a conventional pulse.

Figure 3A:
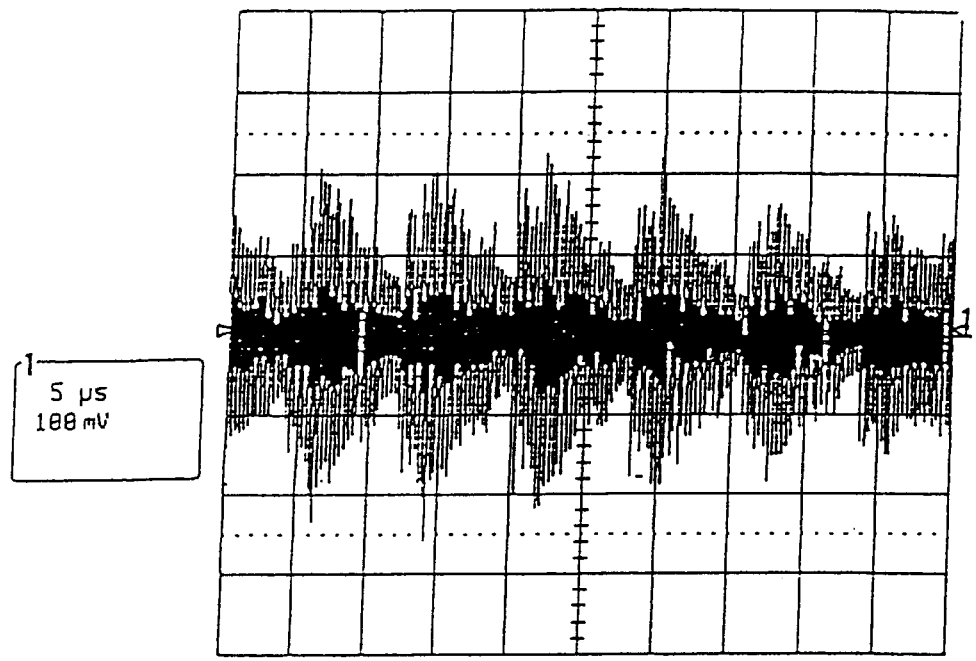
FIG. 3a shows the measured $B_1$ field of the long-composite pulse used to produce the results (according to the invention) of FIG. 2.
Figure 3B:
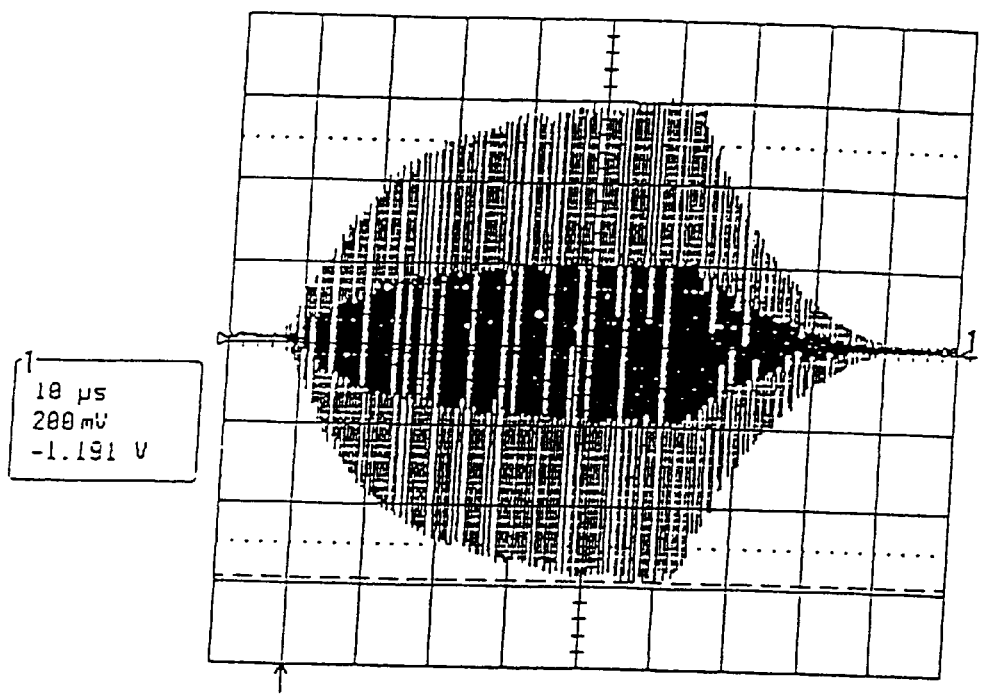
FIG. 3b shows the measured $B_1$ field of a single pulse used to produce the (conventional) results of FIG. 2.

However, the total on time for a given flip angle was only increased by a factor of about 2, suggesting that very short pulse elements produce greater flip angles for a given $B_1 \cdot T$ product. This is to some extent attributable to the fact that the field does not decay completely to zero during the space periods; this is useful in that the amplifier operates more efficiently. Analysis of the results suggests that, even taking into account the increased efficiency, a greater flip angle is being produced than should be expected from the fields and total durations employed. FIG. 3 shows the output of the r.f. probe provided by the above pulse sequence with the above apparatus; this allows the integral of $B_1$ to be calculated over the duration of the pulse. In addition, an appropriate amplitude modulation waveform can be discerned, suitable for use if the composite pulse is generated by (linear) modulation rather than on-off switching. It will be clear from the figure that the "pulse elements" and "spaces" in fact do not appear to the sample to be clearly defined distinct entities, but even where discrete switching is employed, appear to be perturbations in a continuous carrier wave.

Figure 5:
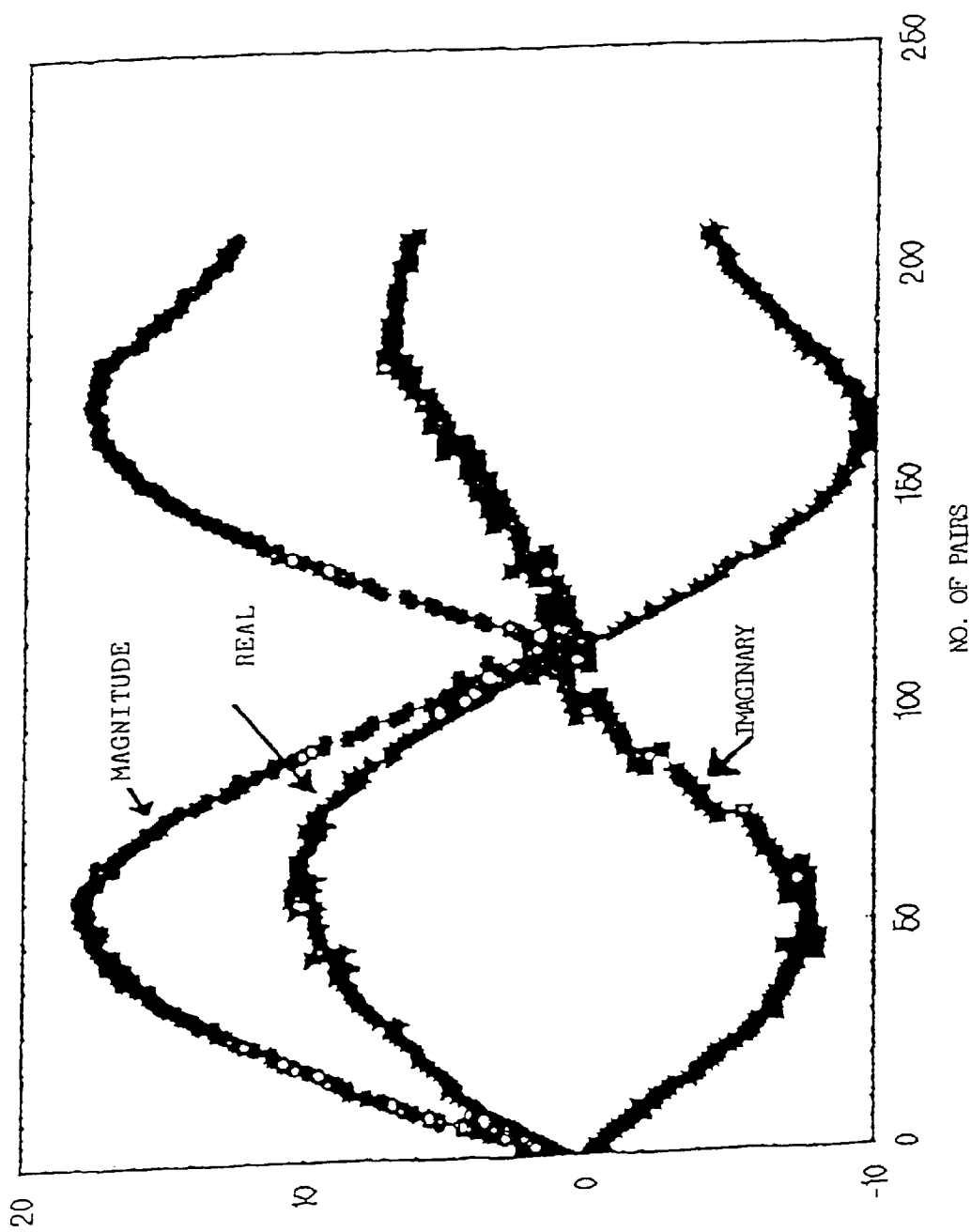
FIG. 5 shows the real and imaginary plots of the received signal for an excitation field strength of 2 mT with a pulse on time of 1.2 $\mu s$.
Figure 6:
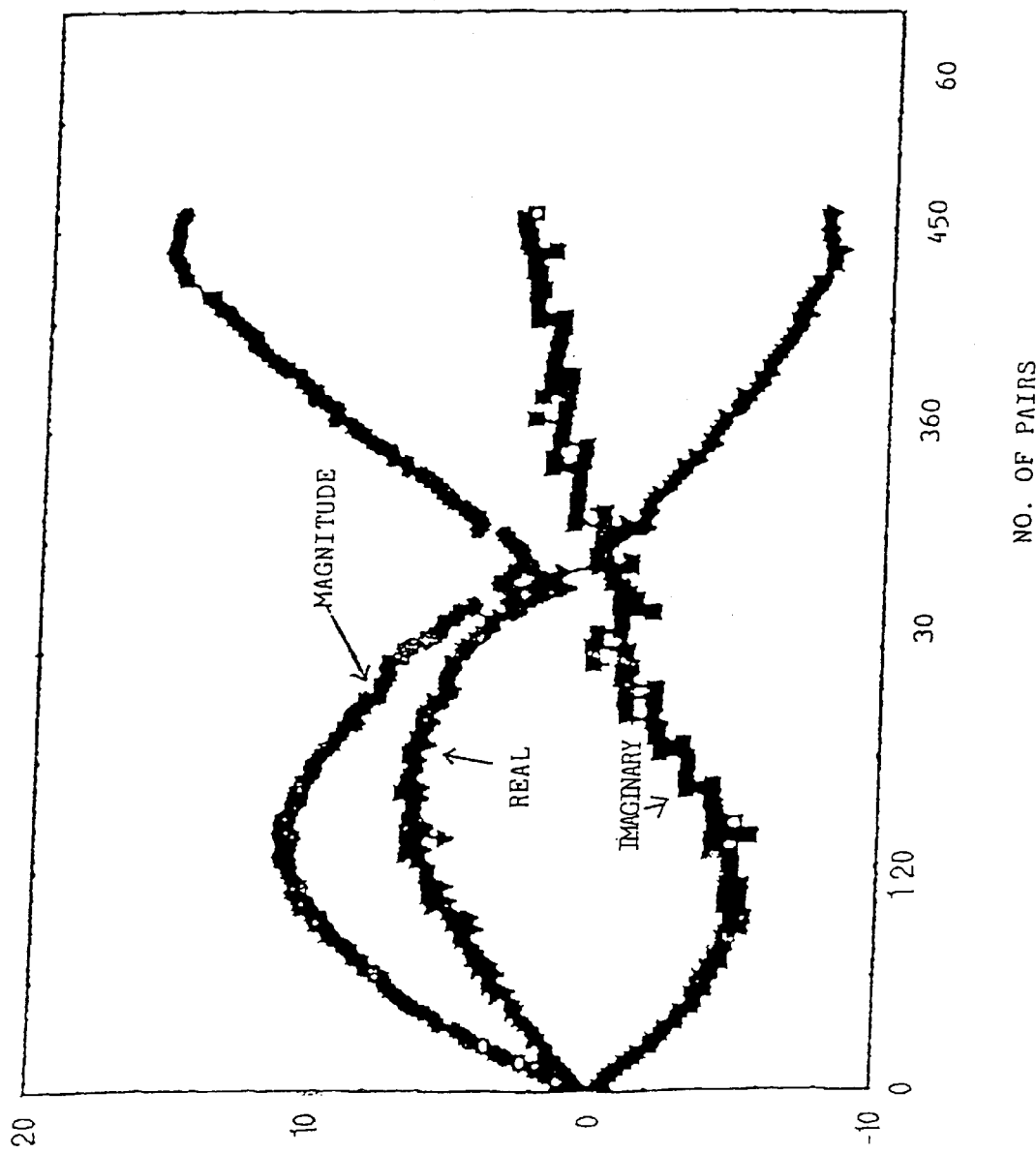
FIG. 6 shows the real and imaginary plots of the received signal for an excitation field strength of 0.7 mT with a pulse on time of 1.2 $\mu s$.

FIG. 4 shows the real and imaginary components of the waveform produced by the long-composite pulse depicted in FIG. 2 over a longer duration; this shows that the sinusoidal behaviour diminishes at higher flip angles. However, if the duration of the pulse elements is reduced, and a greater number of pulse elements are used, the response becomes more closely sinusoidal, as can be seen in FIG. 5, which shows the real and imaginary plots of the received signal for an excitation field strength of 2 mT with a pulse on time of 1.2 $\mu$s. If the $B_1$ field reduced and the number of pulses is increased still further, a second peak of amplitude greater than the first peak can (in some cases) be obtained, as shown in FIG. 6 (where the field used was about 0.7 mT).

Figure 7:
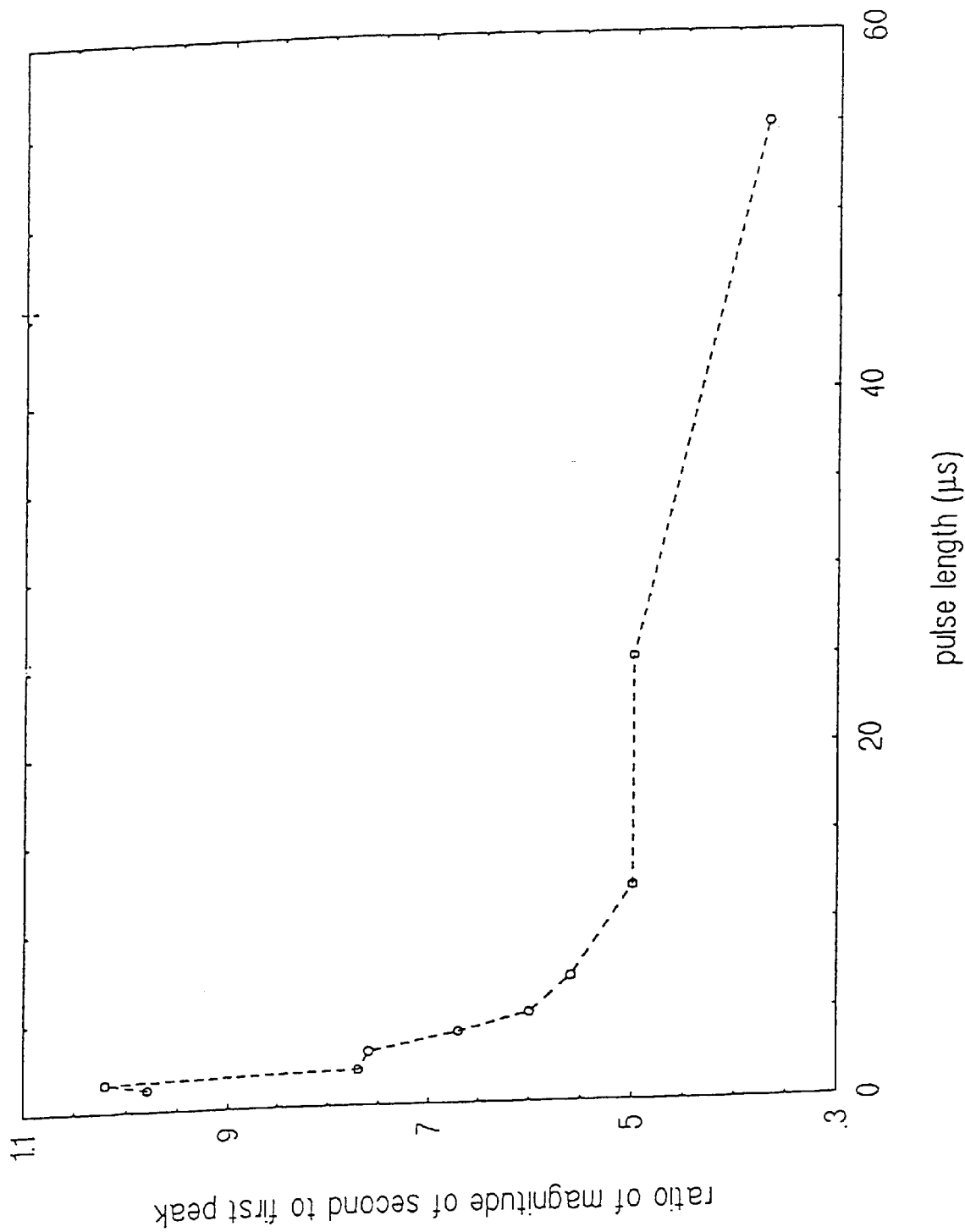
FIG. 7 shows the ratio of the magnitudes of the first and second peaks as a function of length of the pulse elements used.
Figure 8:
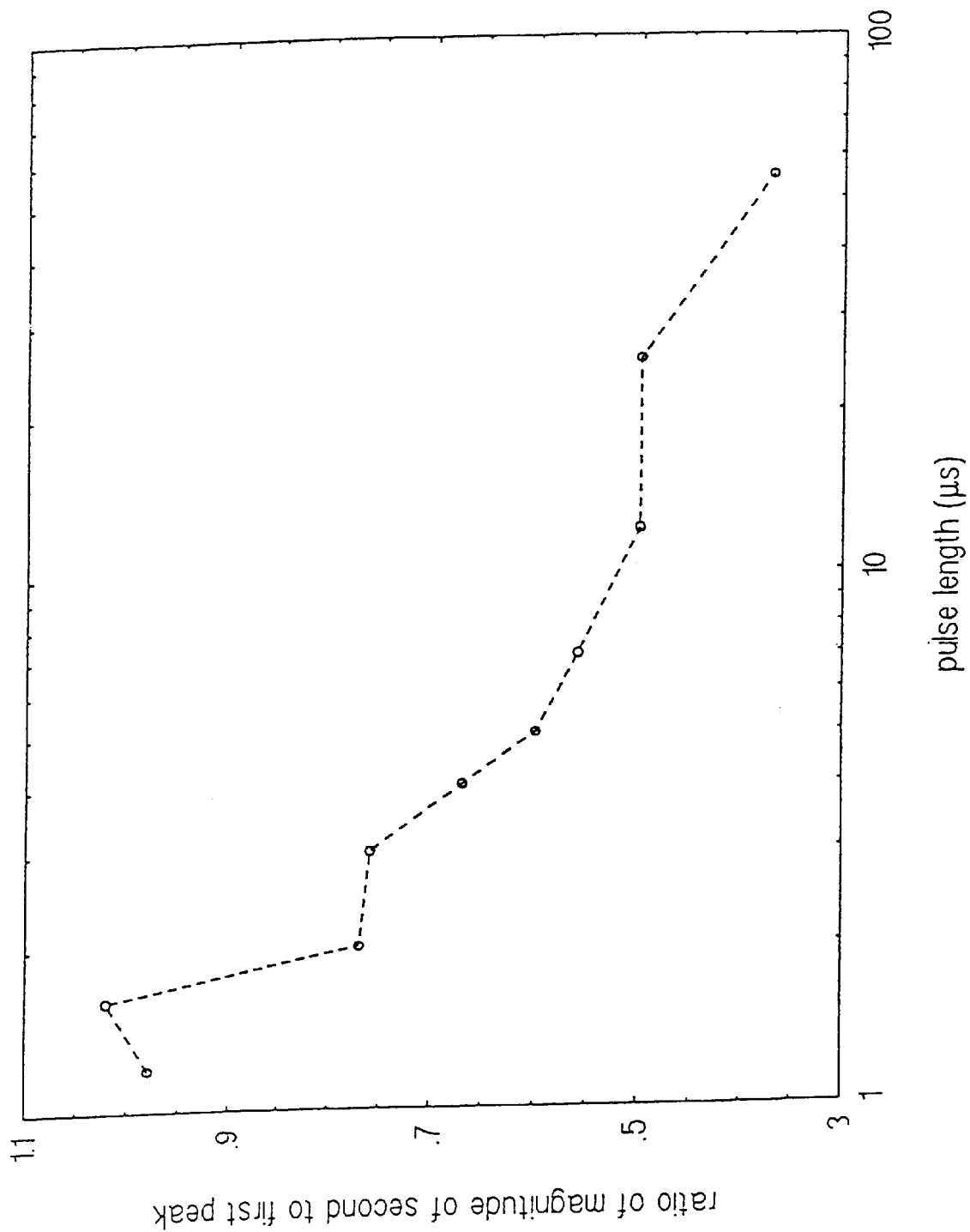
FIG. 8 shows the data of FIG. 7 on a logarithmic scale.
Figure 9:
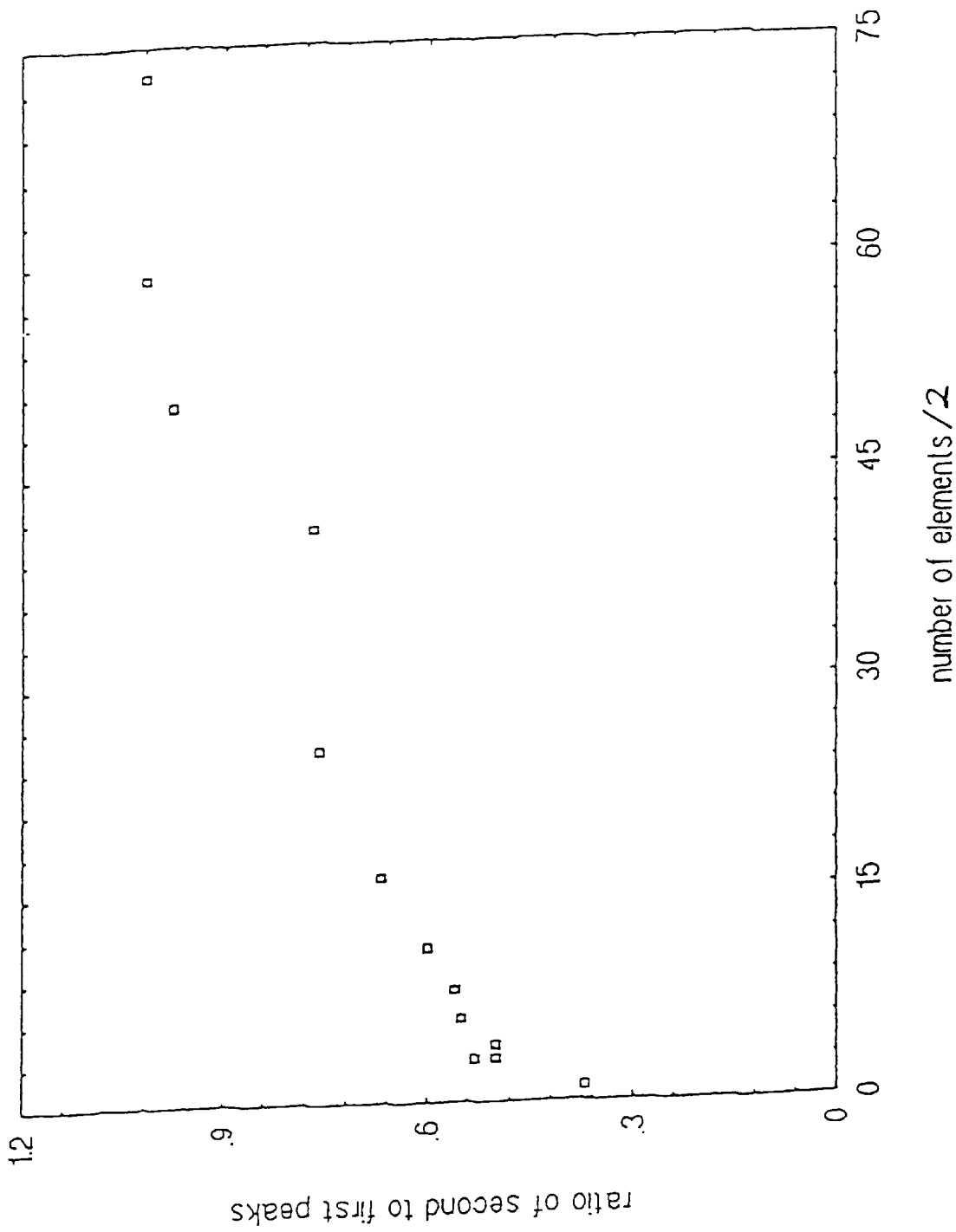
FIG. 9 is a plot of the ratio of first and second peaks against number of pairs of elements.

For many of the advantageous effects mentioned earlier it is desirable to have similar magnitudes for the first and second peaks (for example, 90° and 270° pulses can be employed to yield signals of equal size but opposite magnitude which can then be subtracted or otherwise combined to cancel unwanted signals). FIG. 7 shows the ratio of the magnitudes of the first and second peaks as a function of length of the pulse elements used; the point at the far right of the graph corresponds to a single pulse, and the shorter pulse lengths correspond to increasing numbers of elements in the composite pulse of the present invention. FIG. 8 shows the data of FIG. 7 on a logarithmic scale, and FIG. 9 is a plot of the ratio against number of pairs of elements (effectively a reciprocal plot); from these it can clearly be seen that the ratio of peaks approaches unity as the number of elements is increased. Furthermore, the ratio of peaks corresponds closely to the inversion efficiency, and thus it can be seen that inversion efficiencies of approximately 100% are readily attainable with the composite pulse described above.

Prolonging or delaying response and spectral narrowing

Figure 10:
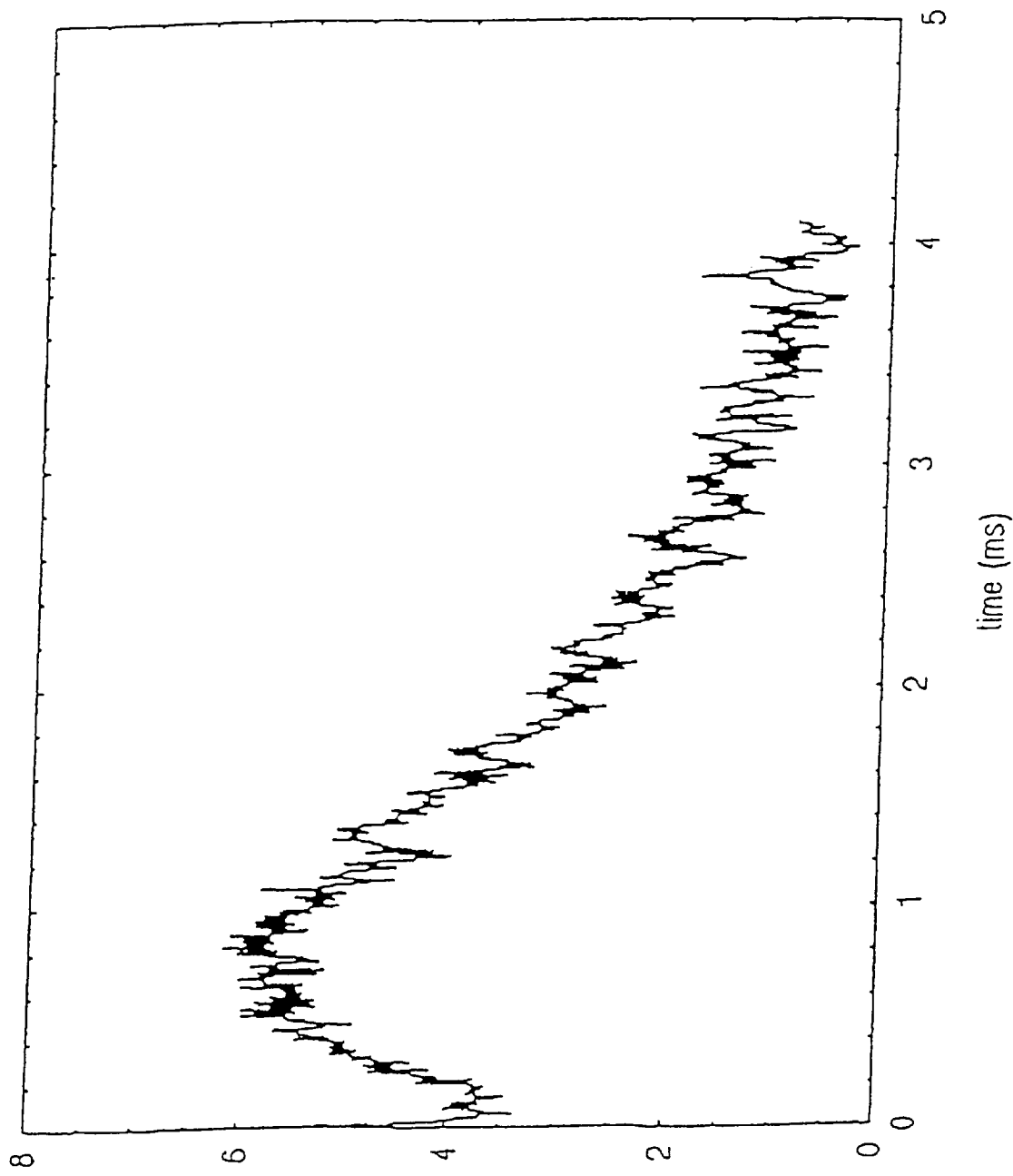
FIG. 10 shows the envelope of the time-domain signal obtained after a single long-composite pulse.

Another advantage mentioned earlier is the ability to prolong the detectable signal after excitation with a pulse and/or to provide a maximum amplitude after a short delay, for example outside the dead-time of the apparatus. FIG. 10 shows the envelope of the time-domain signal obtained (after a dead-time of 300 $\mu$s) after a single composite pulse according to the present invention (again using alternating 0° and 90° phase pulses, and here using 310 repetitions of a pair of 10 $\mu$s pulses separated by spaces of 1.5 $\mu$s within the pair and 2 $\mu$s between pairs). Two features worthy of particular note are the maximum after approximately 1 ms, well outside the dead time of the apparatus, and the relatively long decay, providing approximately 4 ms of useful detectable signal. The extra time-domain signal available results in the Fourier transformed signal (the frequency spectrum) being narrower and better defined than is the case with a conventional single pulse.

Figure 11:
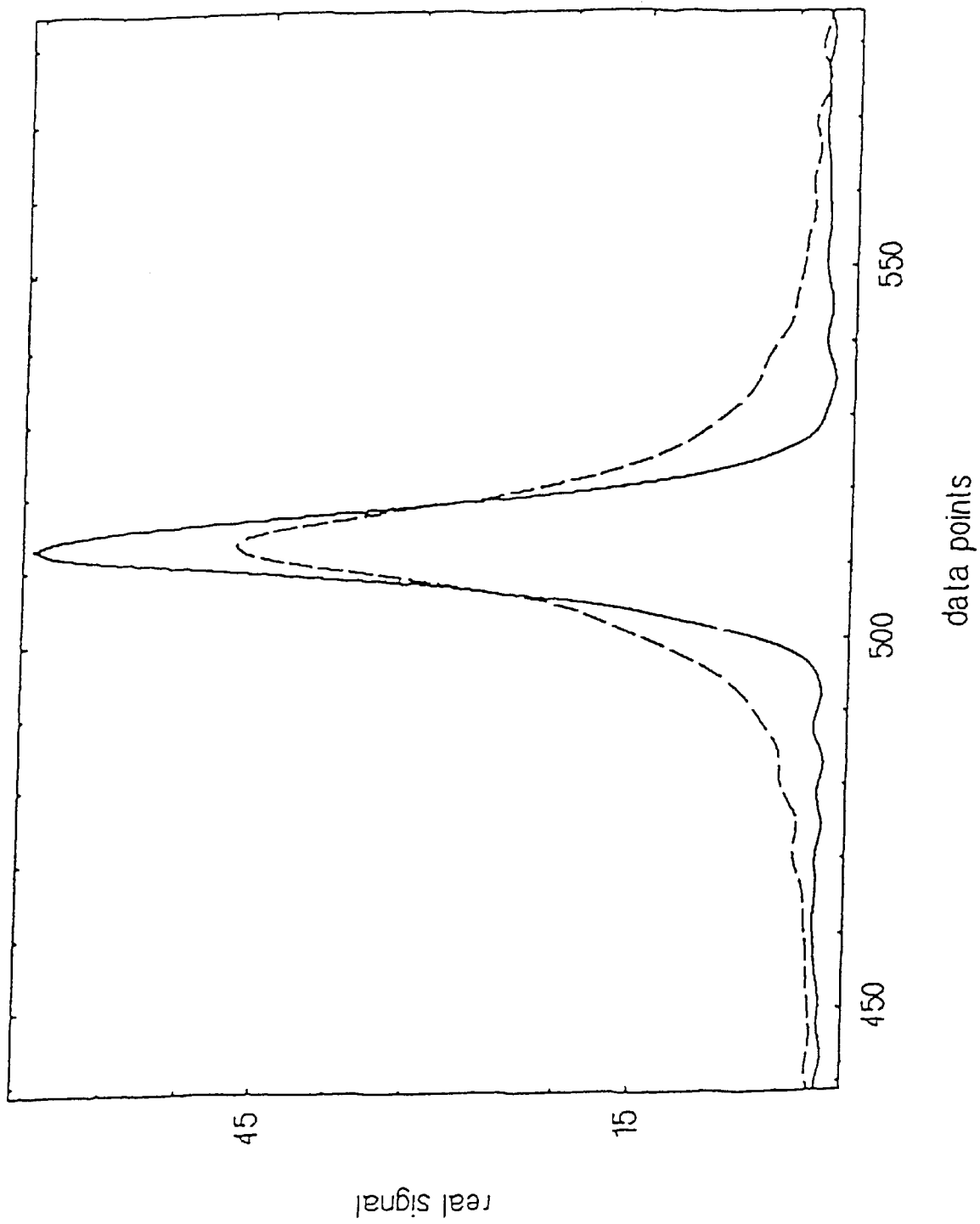
FIG. 11 shows the Fourier transform of the signal produced by a long-composite pulse and by a single conventional pulse of the same effective $B_1$ field.

This sharpening of the response spectrum can be seen clearly from FIG. 11, in which the taller sharper peak is the Fourier Transform of the signal produced by a composite pulse comprising 300 repetitions of a pair of 1.2 $\mu$s pulses spaced 1.5 $\mu$s with 2 $\mu$s between pairs, and the broader, lower peak is the Fourier Transforms of a signal produced with a single conventional pulse of the same effective $B_1$ field.

Figure 12:
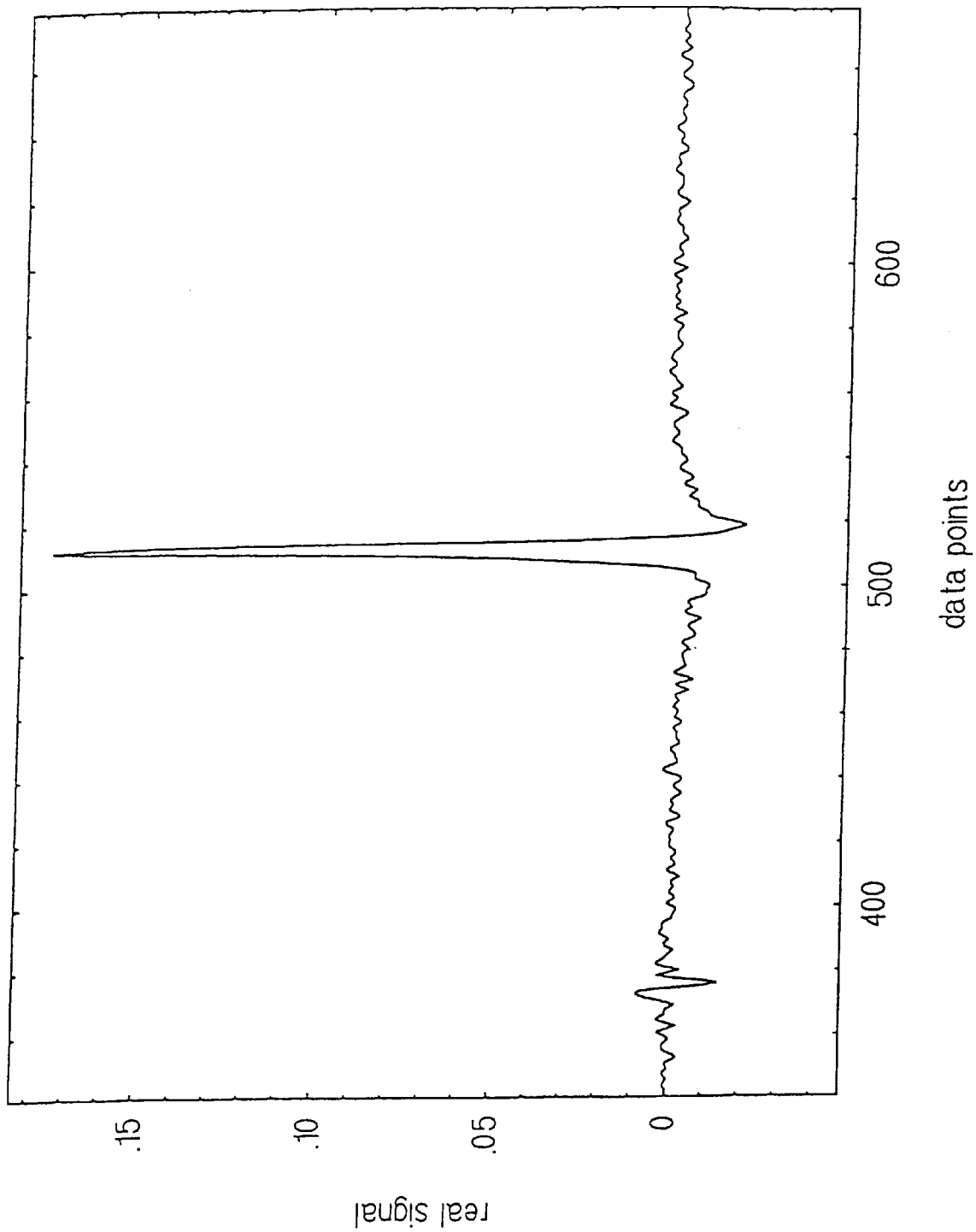
FIG. 12 shows an NQR spectrum obtained for RDX using a long-composite pulse.

Not only can the peak be made sharper, but its characteristic shape can be changed. For example, RDX, which conventionally produces a Lorentzian spectrum (having wide appreciable wings) can be made to produce a narrower spectrum of a different characteristic shape, for example having zero-crossing points, as illustrated in FIG. 12 which was obtained using a composite pulse as follows:

[Pulse element: Phase 0°, duration 4 $\mu$s
Space: 1.5 $\mu$s
Pulse element: Phase 90°, duration 4 $\mu$s
Space: 2 $\mu$s] REPEAT 900 times.

It will be appreciated that a Lorentzian-like curve has an appreciable amplitude far from the central peak, so much of the intensity of a signal is distributed across a wide spectral range. As the range over which signal is detected is increased, noise increasingly affects detection, so conventionally it is necessary to confine detection to a relatively small frequency range, which may contain only a small proportion of the total response signal. The invention allows the response spectrum to be made narrower and taller, so that a larger proportion of the signal can be recovered from a narrower frequency spectrum; this can significantly improve the signal to noise ratio.

Tailoring response characteristic

The above methods are useful in a number of applications, as will be apparent. However, one potentially very useful advantage of certain embodiments is the ability to choose (within limits) a response characteristic, either the function relating magnitude to flip angle or the frequency spectrum for a given sample.

The shape of the response is affected by, in addition to the intrinsic parameters for a given substance ($T_1$, $T_2$ $T_2^*$, I etc.), the pulse element duration, spacing, shape, phase, frequency and number of elements, the latter of which will be referred to below as "pulse parameters". A technique has been developed to produce a pulse which excites a response having characteristics similar to those desired, essentially by a process of evolution. For substances which have an f.i.d. of the order of a few milliseconds, a hundred or so experiments can be performed every second, under the control of a computer, and thus a pulse of the required characteristics can be artificially "bred" over a large number of generations, over the space of a few hours or days, depending on the ease of attainment of the characteristic. The basic technique (which can be adapted, particularly as heuristics are developed) is described below.

1) Information identifying the desired response characteristic, for example in the form of a curve of desired magnitude against flip angle, time-domain signal or frequency spectrum is input. Optionally, a parameter indicating the minimum degree of fit required is also input.

2) An initial pulse sequence is generated, for example the sequence described above for producing a sinusoidal dependence.

3) A plurality of "mutant" sequences are generated, either pseudo-randomly, genuinely randomly, or according to predetermined rules, each differing from the initial pulse (by a relatively small amount) in at least one "pulse parameter". For example, several pulse sequences of differing spacing, differing relative phases or durations and so on may be generated.

4) An experiment is performed on the sample using each of the sequences in turn to define a composite pulse, the experiments optionally being repeated to reduce noise, and the results for each sequence stored. If the response magnitude as a function of pulse length is being selected, then each sequence will be performed for a different number of repetitions, to achieve different flip angles, and the data for each set stored. If the frequency spectrum is being selected, then a fourier transform on the time domain signal may be performed.

5) The results are compared to the desired characteristic, and a measure of correlation obtained. If the measure of correlation is acceptable (that is above a predetermined minimum), then the pulse sequence(s) corresponding to that output are reported or stored as sequences to be used.

6) If the results are not acceptable, the process is repeated, using the sequence with the best correlation as an initial sequence.

The selection may be "intelligent" in that it attempts to identify trends, and not to repeat unsuccessful variants, or may be "blind" and based purely on random generation of sequences. Intelligent selection may converge faster on a desired pulse sequence, but may fail to identify sequences where the dependence on a particular parameter becomes highly unpredictable. Pseudo-random variations, preferably with the probability of a drastic variation being small but finite, are more likely to find an appropriate sequence if it exists, but may take longer to converge.

It will be appreciated that it may not be possible to generate a particular desired behaviour in some circumstances. However, the techniques disclosed can allow substantial adjustment of characteristics, and in particular allow highly sinusoidal behaviour to be attained relatively easily.

Echo following two pulses

Figure 13:
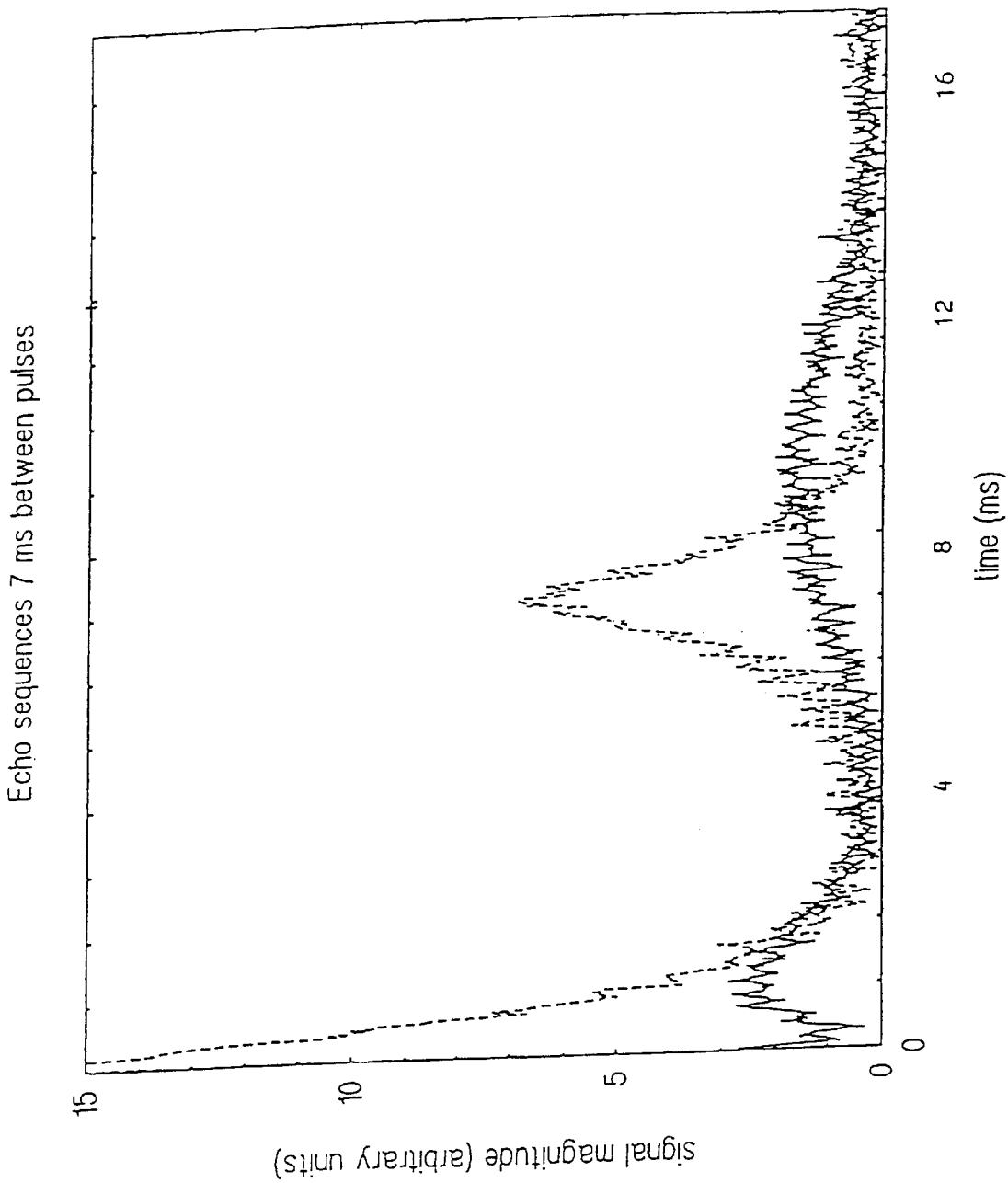
FIG. 13 shows the envelope of the time domain response signal following two pulses 7 ms apart.

Referring to FIG. 13, the envelope of the time domain response signal following two pulses 7 ms apart is shown, the solid line showing the response to two echo long-composite pulses of the present invention, and the broken line showing the response to two single pulses (of approximately 90° effective flip angle). As can be seen, the composite pulse of the invention (in this case again a 0,90 degree phase-alternated sequence) shows two maxima following termination of the pulse, rather than the single echo observed with conventional excitation. The area under curve of signal envelope for the echo produced by the long-composite pulses is approximately 70% of that under the curve for the echo produced by a pair of single pulses under the same conditions of pulse spacing and coil excitation voltage. However, the observed r.f. field produced by the coil was approximately 30% of that for the single pulses and the $T_2^*$ (measured from the echo maximum) was approximately 3 times longer. Thus, if a pair of long-composite pulses are used to generate an echo, at least twice the signal-to-noise ratio can be obtained from an r.f. peak field strength of 30% of the field strength used with a pair of single pulses. This allows better results to be obtained with a lower risk of perturbing sensitive electronic circuitry.

Figure 14:
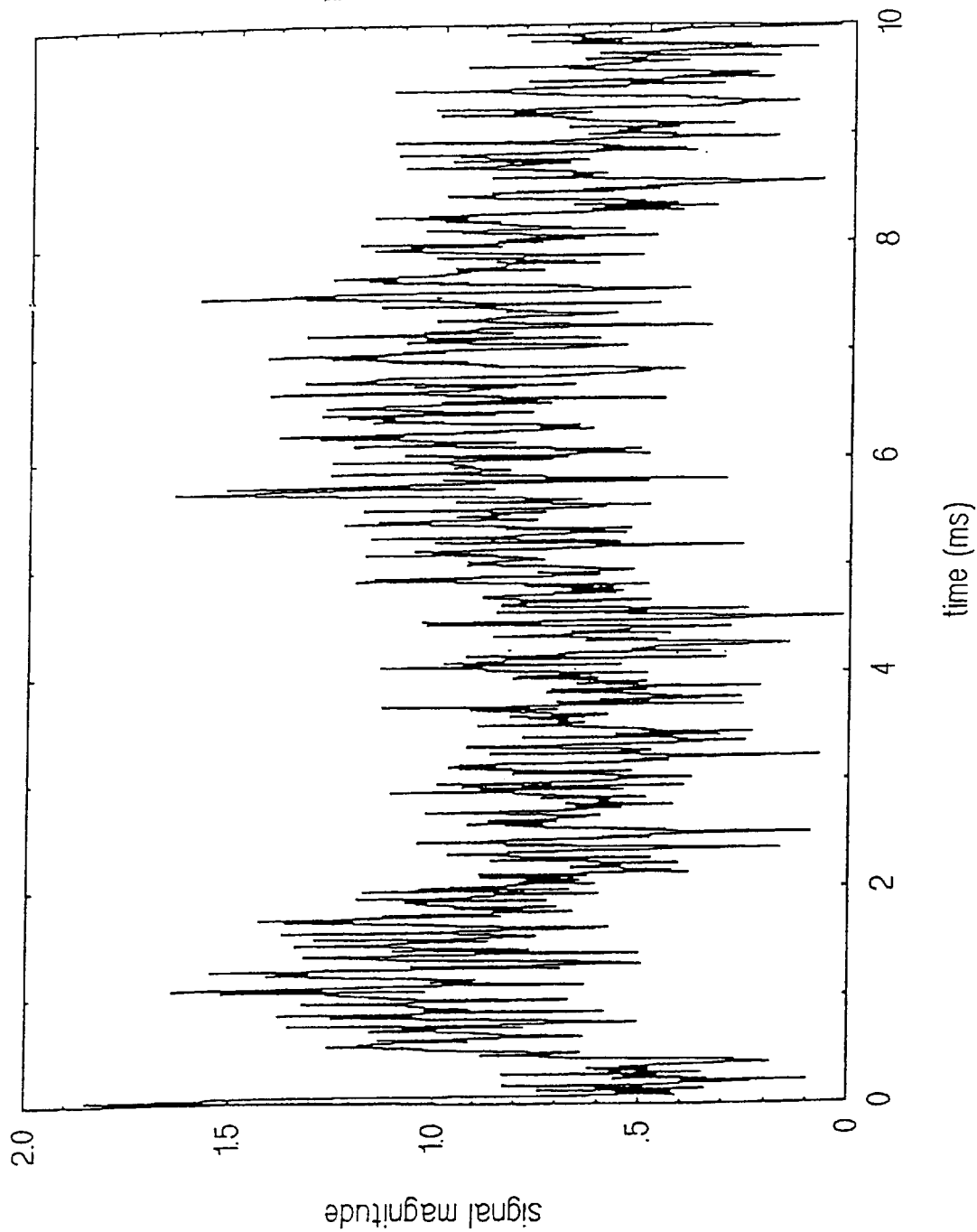
FIG. 14 is a plot of signal magnitude against time following excitation with a long-composite pulse.

By choosing the spacing between the long-composite pulses approrpiately, it is possible to produce a response signal which retains an appreciable amplitude for many times longer than $T_2^*$. FIG. 14 is a plot of signal magnitude against time following excitation with a composite pulse as follows:

[Pulse element: Phase (arbitrary) 0°, duration 1.2 $\mu$s

Space: Duration 3.5 $\mu$s] REPEAT 1000 times

The results show that a signal which persists for a duration of the order of 10 ms (having an apparent $T_2^*$ of 5–6 ms, that is close to $T_2$ or $T_{1\rho}$ and 7–8 times the normal value of $T_2^*$). The results also demonstrate that the beneficial effects of the invention can be achieved even when there is no phase shift between successive pulses in a composite pulse, and when mark-space ratios are less than 1.

Another important feature of the results is that a sizeable signal is detectable after 4 or 5 ms. This is very important in reducing the effects of spurious signals, particularly acoustic ringing which can last as long as 2–4.5 ms and has been hitherto difficult to eliminate.

A filter function can be matched to the signal envelope, to provide improved discrimination of the signal from background noise or spurious signals.

Detection of PETN

Figure 15:
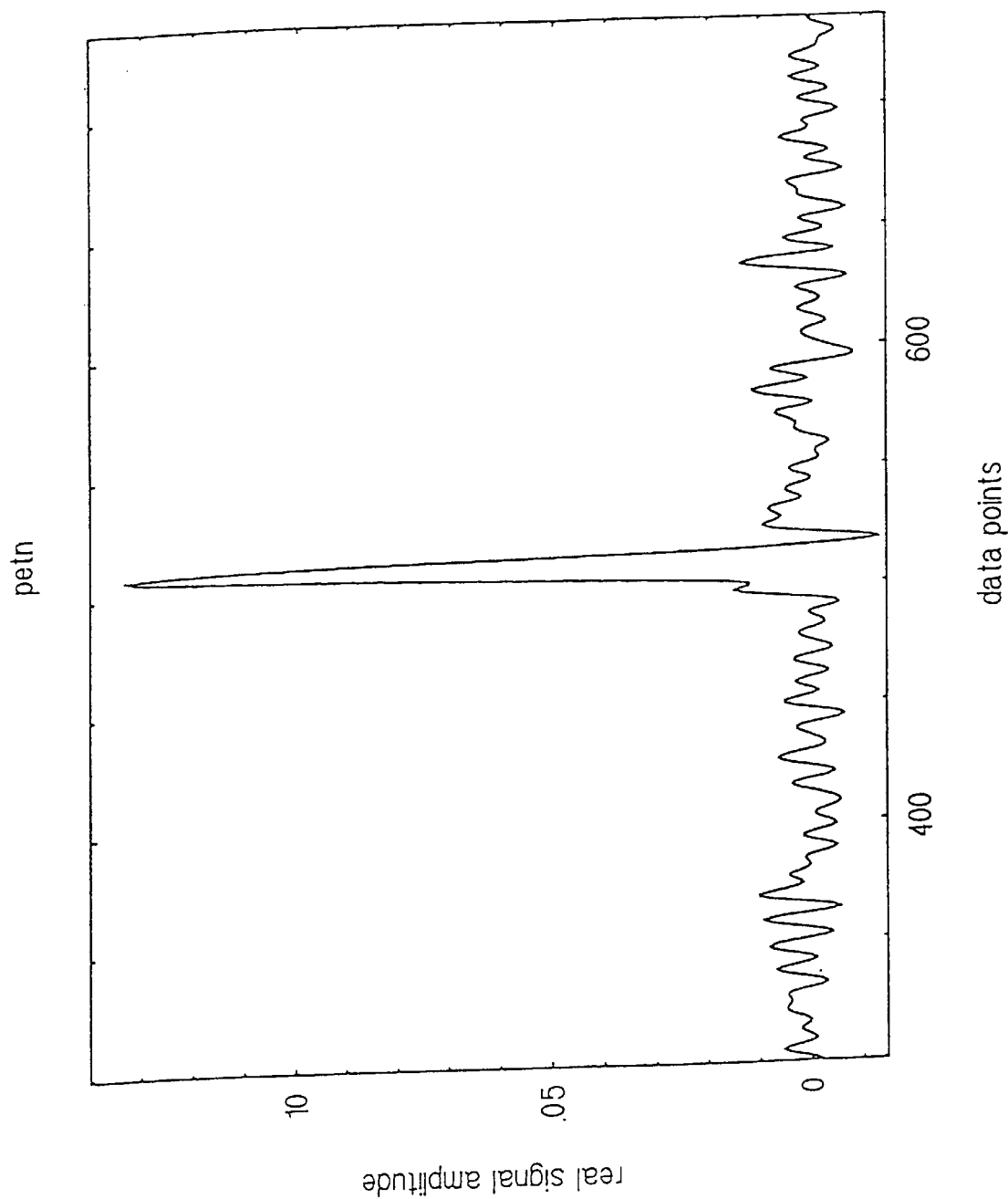
FIG. 15 shows the Frequency spectrum of a sample of PETN excited with a long-composite pulse.

PETN has a long $T_1$ period which limits the number of repetitions which can be carried out in a practical experiment. This adversely affects the signal to noise ratio, reulsting in problems in detecting PETN reliably. Embodiments of the invention allow a greatly improved signal to noise ratio to be obtained, and have made detection of PETN readily achievable. FIG. 15 shows the Frequency spectrum of a sample of PETN excited with a pulse sequence as follows:

[Pulse element: Phase 0°, duration 1.2 $\mu$s

Space: Duration 1.5 $\mu$s

Pulse element: Phase 90°, duration 1.2 $\mu$s

Space: Duration 2 $\mu$s] REPEAT 500 times. As can be seen, the sample produced a clearly defined peak at the expected frequency after a single composite pulse. By way of comparison, it can be mentioned that a peak became clearly evident after only about 8 repetitions of the experiment, whereas when a conventional rectangular pulse was used, at least 40 repetitions (each taking at least about 20–30 seconds) were required before an NQR response signal became discernable. Thus, the pulse sequences of the invention can bring about a reduction of testing time from about 20 minutes to about 3 minutes and yet achieve a better signal-to-noise ratio.

Figure 16:
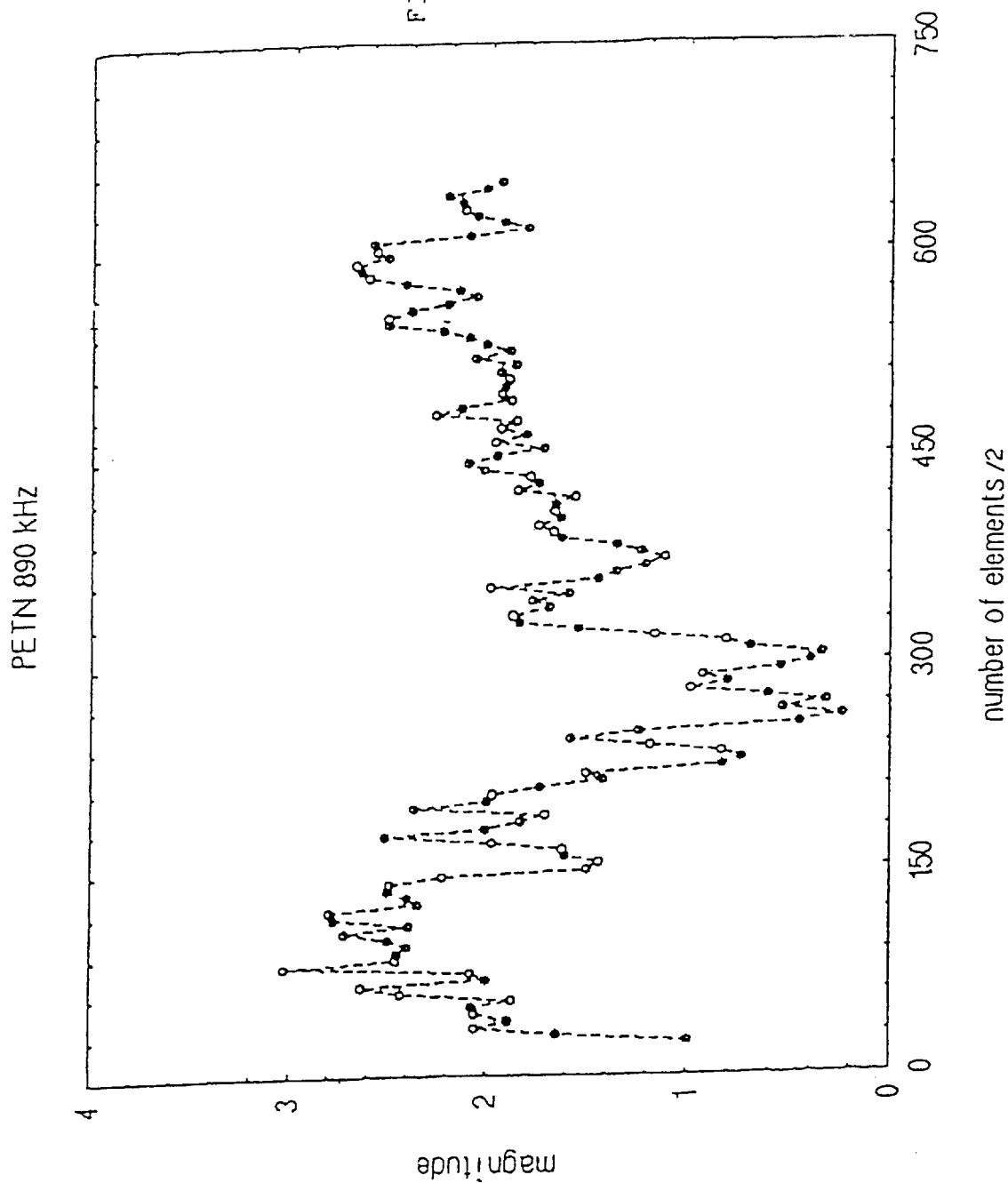
FIG. 16 shows the response signal magnitude as a function of the number of pairs of pulse elements for the 890 kHz line of $^{14}N$ in PETN.

Referring to FIG. 16, the response signal magnitude as a function of the number of pairs of (0°, 90°) pulse elements (according to the above sequence) for the 890 kHz line of $^{14}$N in PETN is shown. PETN has previously been troublesome to detect due to its broad response and long $T_1$ (approx 30 seconds) which makes repetition of experiments impractical. However, the results of FIG. 16 clearly identify an NQR response signal readily distinguishable from background noise using a composite pulse of several hundred elements.

Detection of HMT

Figure 18:
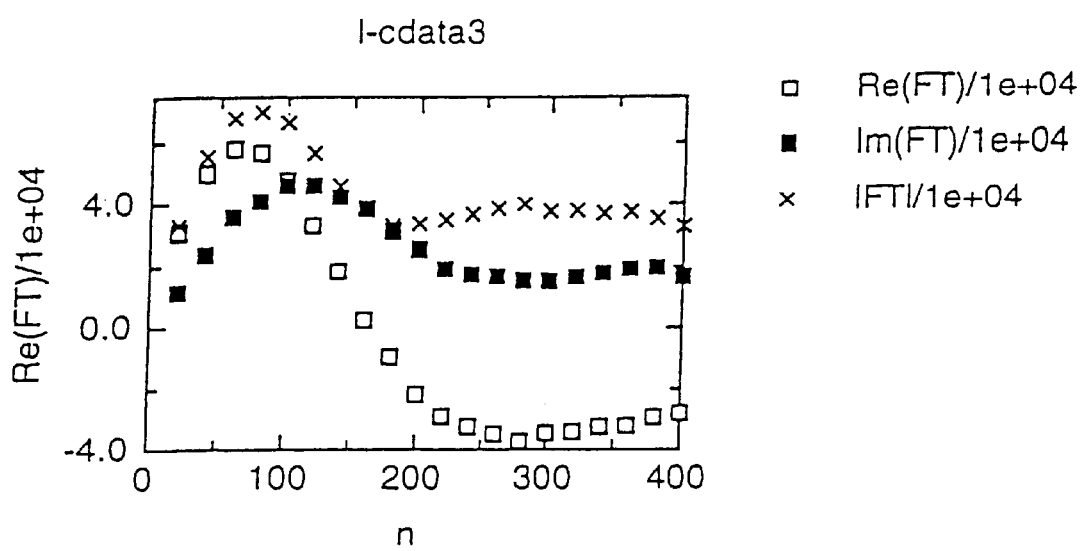
FIG. 18 shows the near sinusoidal dependence of response on flip angle observed in hexamethylene tetramine (HMT) at 3.307 MHz, up to an angle of about about $270°_{eff}$.

Similar responses to the ALPS sequence are observed in materials other than RDX and PETN. The $^{14}$N FID in hexamethylene tetramine at 3.307 MHz shows a near sinusoidal dependence on flip angle up to 270°$_{\mathit{eff}}$, as can be seen in FIG. 18, beyond which deviations are observed due to inhomogeneities in the $B_1$ field. It can be seen that at 270°$_{\mathit{eff}}$ approximately 80% of the magnetisation has been inverted.

The ability to generate a genuine 270°$_{\mathit{eff}}$ pulse can be used to reduce the distortions in the FID due to probe ring-down and produce a useful reduction in the strength of spurious signals, e.g. piezoelectric responses from sand. In experiments designed to demonstrate this reduction of spurious signals, a solenoidal coil was loaded successively with 140 g of hexamethylene tetramine (HMT) and 190 g of sand; the FID response of each to a 90°$_{\mathit{eff}}$ ALPS sequence (A) comprising 48 repetitions of a 2 microsecond pulse followed by a 2 microsecond space is shown in in the third column of the table below, and FID difference of a 90°$_{\mathit{eff}}$ ALPS followed by a 270°$_{\mathit{eff}}$ pulse (B) comprising 150 repetitions of such elements is shown in the fourth column.

| Sample | Quantity/g | Relative FID Magnitude after (A) | Relative Difference FID in magnitude after (A + B) |
|---|---|---|---|
| Sand | 190 | 12.6 | 1.93 |
| HMT | 140 | 1.65 | 1.98 |

As expected, the HMT difference intensity is increased by the combined sequence (A+B) [from 1.65 to 1.98], whereas that of sand is reduced by a factor of 6.5. This clearly demonstrates that an inversion pulse can be effectively used to reduce spurious signals.

The line shape of the NQR response can be tailored to correspond to a specific line shape by systematic variation of the pulse sequence; for example in HMT, the ALPS sequence comprising a series of 4 microsecond pulses separated by 2 microsecond spaces generates a Lorentzian line shape for the Fourier transformed FID when n=18, and a near Gaussiau when n=200. Intermediate values of n give intermediate line shapes. FIG. 19 shows the resultant line shape for n=200 (inner curve), compared with the original Lorentzian for n=18 as the outer curve.

Selective excitation

The long-composite pulses have a well-defined frequency, and can be used to excite a narrow range of frequencies without suffering from the adverse effects of reduced intensity that is observed when long single pulses are used. This can be particularly important in detecting substances such as proteins which exhibit several similar resonant frequencies.

Imaging

The sinusoidal dependence of the response signal magnitude on flip angle allows a number of techniques previously applied to processsing of response signals from an NMR experiment. In particular, techniques based on the rotating frame model (used in NMR) may be applied to NQR experiments. A discussion of rotating frame spectroscopy and spectroscopic imaging can be found in the paper by P. Styles in NMR Basic Principles and Progress, Vol. 27, 1992, pages 44–66, Springer-Verlag, Berlin.

Phase Encoding

The long-composite pulses may be employed to phase-encode the response signal, using the principles discussed in our application filed on the same date. Specifically, a sample can be excited with a first long-composite pulse having a first phase followed (substantially immediately) by a second long-composite pulse having a second phase, the first and second phases preferably differing by about 90°.

The principles discussed in our co-pending application (Agent ref: PDC/IK/19089) filed on even date herewith and incorporated herein by reference may be applied using the long-composite pulses of the invention.

Definition of phase of a long-composite pulse

It may be useful to incorporate the long-composite pulses of the invention in sequences in which the phase of successive long-composite pulses is altered. As will be appreciated, a composite pulse may contain elements of a plurality of phases, and so the overall phase of the composite pulse is not implicitly defined. In sequences, the absolute phase of each composite pulse is unimportant, but phase differences between composite pulses need to be defined or a method of producing predetermined phase differences established. Various definations can be adopted, provided the defination remains the same for each sequence. The following definitions have been found useful:

1) Where the phases of all pulse elements of a long-composite pulse are the same, the phase of the composite pulse can simply be defined as the phase of the pulse elements. An "absolute" phase can be defined, and phase differences between composite pulses can be determined by subtracting absolute phases.
2a) Where the composite pulse has pulse elements of a plurality of phases, a composite pulse having a phase differing by a predetermined offset can be produced by adding the phase offset to each pulse element.
2b) Alternatively, only some of the elements may have their phases changed. In such a case, the phase of a composite pulse may be defined as the receiver phase at which maximum (positive) real signal is detected following a single composite pulse; this allows phase differences to be determined reliably and can be used in a variety of cases.

Phase Cycling

The long-composite pulses of the invention may be employed in longer sequences in which the phase of the pulses is cycled to reduce interference. Further discussion can be found in our earlier International Patent Application No. WO 96/26453 incorporated herein by reference.

In a sequence of r.f. pulses, of any amplitude, length and shape, which has been designed to distinguish between genuine NQR signals and spurious interference from the sample by means of phase cycling, it is important to compare and manipulate responses generated by r.f. pulses which as far as possible have the same relative phase. In other words, "like" is compared with "like"; this principle is termed herein the principle of "phase equivalence". This applies whether the pulses are single pulses or long-composite pulses. The long-composite pulses can be used advantageously where single pulses are used, particularly for flip angles of 180° or greater.

It is also advisable that these pulses be identical in other respects such as amplitude, frequency, shape and length, or at least that the consequences of any such differences can be allowed for, but the principle of equivalent phases is the most important. Satisfying this principle can ensure that any spurious response, the phase of which differs from that of the exciting pulse by an unknown amount, can be annulled by means of a suitable phase cycle.

The pulse sequences of the phase-cycling method can satisfy the principle of phase equivalence.

The response of many materials to an r.f. pulse may depend on the precise phase of that pulse, not merely its amplitude. The response may also depend on the length of the pulse. Conversely an NQR signal generated by an exciting pulse has its phase determined by the phase of the pulse, but the actual shape of the response appears to be relatively independent of the phase of the exciting pulse.

It is believed that the principle of phase equivalence is important since interfering substances such as sand can generate responses whose phase is not precisely defined by that of the excitation pulse. There is a phase shift between the excitation pulse and the spurious response, which may therefore vary according to the excitation phase and as the spurious signal decays.

In order to obtain cancellation of the spurious interfering signals, it is necessary to prepare the spin system in different ways prior to the r.f. pulse so that it will respond in two or more different ways to identical r.f. pulses. This preparation must be done sufficiently far before the signal acquisition stage to allow any effects due to the preparation on other elements of the system to have become negligible.

In the phase-cycling method, this can be achieved by arranging the phases of respective pulses preceding (preferably immediately preceding) the two phase equivalent pulses being compared to be different. Preferably the phases differ by 180°, but lesser phase differences could also produce satisfactory results.

In order that the comparison yields meaningful results, it is preferred that the first and second individual pulse sequences (if provided) generate respective nuclear response signals of the same magnitude but of differing phase. This is achieved in the preferred embodiments by having the same number of pulses in both sequences, by comparable pulses in each sequence having the same phase, and by comparable pulses in each sequence generating the same flip angle. If, aside from the initial pulse, more than one further pulse is provided per individual sequence, such pulses may each be separated by the same pulse separation; that separation may be larger than the separation between each initial pulse and the next pulse in the sequence.

Three different preferred embodiments of the phase-cycling method, all adhering to the above principles, are now described for use with the testing apparatus described above.

PHASE CYCLING—SPIN LOCKING SEQUENCES

In a first preferred embodiment of the phase-cycling method, in brief interfering signals are removed from the free induction decay following two radio-frequency pulses comprising a "spin locking" (SL) type sequence.

The basic technique is to use an initial preparation pulse of flip angle 90° and phase 0° (termed a "$90°_0$." pulse) to rotate the magnetization into parallelism with (say) the Oy axis of the rotating frame ($B_o$ lies along Oz and $B_1$ along Ox). This pulse is then immediately followed by the so-called spin locking pulse of variable length and a phase shifted by 90° with respect to the first. Hence the combination of the two pulses can be written in the form $(90°)_0.-t_{90}.$, where "t" represents the adjustable length of the second pulse. The combination of the two pulses is sometimes known as a sandwich or composite pulse. However, herein, throughout, the combination is regarded as two distinct pulses.

In the spin locking phase of the cycle, the magnetization is parallel to the r.f. field, and is observed to decay with a time constant $T_{1\rho}$, the spin-lattice relaxation time in the rotating frame. In contrast, after a single 90° pulse, the magnetization would decay with a time constant $T_2$ or $T_2^*$. In many substances $T_{1\rho}$ is much closer to $T_1$ than $T_2$ or $T_2^*$; since in solids $T_1 >> T_2$, spin locking can conserve the magnetization for a much longer period of time.

In the first embodiment of the phase-cycling method, effectively the increased relaxation time is employed to distance the signal detection in time away from any interfering signal generated by the first, initial pulse of the sequence, and then any interfering signal following the second, spin locking pulse is removed by a comparison technique employing phase shifting, as described in more detail later.

One particularly important feature of the phase-cycling method is the discovery that spin locking techniques function in NQR. This was unexpected, because of the multiplicity of different orientations of the crystallites in a powdered sample with respect to $B_1$, giving rise to a range of spin locking r.f. fields. Furthermore, in NQR $B_1$ must be larger than all other "internal" fields, such as dipolar interactions and inhomogeneity broadening. Also, there is no direct equivalent of the NMR rotating frame in NQR, in which the effect of the static magnetic field is viewed as an effective rotation close to the Lamor frequency.

The comparison technique referred to above, employing phase shifting or cycling, is now described in more detail with reference to a number of variants of the first embodiment.

First variant of the first embodiment—basic pulse sequence

In a basic variant of phase shifting, illustrated with reference to FIG. 17(a), any interfering signals generated by the second pulse are removed by the use of two pulse sequences (designated "A" and "B") which are as nearly as possible identical except that the phase of the initial pulse in the latter sequence (B) is shifted by 180° with respect to the phase of the initial pulse in the former sequence (A). As suggested above, in the latter B sequence this has the effect of shifting the phase of the NQR response signal following the second, spin locking pulse by 180°, but has no effect on the phase of the interfering signal, whose phase depends only on the phase of the immediately preceding pulse.

Hence, in this basic variant of phase shifting, as illustrated in FIG. 17(a), in the first (A) pulse sequence the pulse sequence $\alpha_0$.-$t_{90}$. is generated, with the signal being acquired following the second, spin locking pulse. The signal $S_A$ includes both the free induction decay NQR response signal ("Q") and the interfering signal ("I"):

$$S_A = Q + I$$

In the second (B) pulse sequence, the two pulses are identical to the corresponding pulses in the first sequence, save that the phase of the initial, preparatory pulse has been shifted by 180°. Hence the sequence is $\alpha_{180}$.-$t_{90}$., which generates the signal $$S_B = -Q + I$$

Subtraction of $S_A$ and $S_B$ then removes I and sums Q.

Usually a large number of A and B sequences would be applied to the sample, to improve the signal to noise ratio, with the results from the two sequences either being separately accumulated or being processed immediately. The sequences may for instance be performed in the order ABABABAB . . . , or in the order AAA . . . BBB . . . . Usually the same number of A and B sequences would be performed, with the intent that the comparison between the A and B sequences is as close as possible.

Second variant of the first embodiment—full phase cycling

In a more complex but more effective version of the first preferred embodiment, a complete phase cycle is utilised in which all possible combinations of the phases of the two pulses in the pulse sequence are used, subject to the condition that the first pulse differs in phase from the second by 90°. Hence one possible set of phase cycled sequences, using four pairs of individual sequences, is as follows:

| Sequence type | Phase of first pulse (P1) | Phase of second pulse (P2) | Receiver Phase | Real Channel | Imaginary Channel |
|---|---|---|---|---|---|
| A | 0° | 90° | 90° | +Y | −X |
| B | 180° | 90° | 270° | −Y | +X |
| A | 90° | 180° | 0° | +X | +Y |
| B | 270° | 180° | 180° | −X | −Y |
| A | 180° | 270° | 270° | −Y | +X |
| B | 0° | 270° | 90° | +Y | −X |
| A | 90° | 0° | 0° | +X | +Y |
| B | 270° | 0° | 180° | −X | −Y |

It is to be noted that the shift in the receiver phase between the A and the B sequences is 180°, so that subtraction of the B sequence signals from the A sequence signals can be effected. It is also to be noted that the receiver phase is not necessarily in phase or anti-phase with the phase of the second pulse. Any phase values will suffice provided that they have the effect of subtracting the B sequence signals from the A sequence signals, or vice versa. This point is illustrated in the last two columns of the above table, which show the signal components X+iY in the two receiver channels as the receiver phase is switched. The sum of the components over the eight permutations of phase is zero, as indeed is their sum over each pair of individual pulse sequences. This demonstrates that the interfering signals generated by the second pulse cancel, whereas the NQR response signals are preserved because of the 180° shift in the phase of the initial pulse between each A and B sequence.

Whereas the above four pair sequence cycles the phase of the P2 pulse by 90° for each pair of individual pulse sequences, a simpler two pair phase cycle version is also possible, which cycles the phase by 180°. This is as shown below:

| Sequence type | P1 | P2 | Receiver Phase | Real Channel | Imaginary Channel |
|---|---|---|---|---|---|
| A | 0° | 90° | 0° | +X | +Y |
| B | 180° | 90° | 180° | −X | −Y |
| A | 180° | 270° | 180° | −X | −Y |
| B | 0° | 270° | 0° | +X | +Y |

The presently described full phase cycling variant of the first embodiment (either in its four or eight cycle form), can assist not only in the removal of interfering signals, but also in the removal of baseline drift and error, as well as in solving problems caused by minor imperfections such as phase errors in the individual excitation pulses. This variant may be used with the remaining variants described herein.

The remaining variants (the third and fourth variants) of the first embodiment each use a combination of two or more pulses and/or different widths. In the third variant (phase split pulses) such a combination is used in the spin locking pulse; in the fourth variant (stacked pulses) such a variant is used in the initial preparatory pulse.

Third variant of the first embodiment—phase split pulses

Variations in temperature or other such environmental parameters may affect the resonance frequency of the nuclei under investigation. Whilst the pulse sequence shown in FIGS. 17(a) can operate successfully at off-resonant conditions, over a limited bandwidth, an alternative version of the pulse sequence is capable of considerably better off-resonant performance. This sequence, involving the use of what are herein termed "phase split pulses", is now described with reference to FIGS. 17(b). The sequence is capable of increasing the NQR signal.

The background to the alternative pulse sequence is as follows. During the spin locking phase of sequence A shown in FIGS. 17(a), at off-resonant conditions the magnetization generated by the first pulse processes (or nutates) about the resultant of $\omega_1$ and $\Delta\omega_Q$ (where $\Delta\omega_Q$ is the off-resonant frequency shift), so that the magnetization vector dephases. It has been found pursuant to the present phase-cycling method that, to take into account the difficult conditions in the rotating frame and to improve the sensitivity of the tests off-resonance, it may be advantageous to regenerate the initial state. This, it has been found, can be achieved by reversing the direction of $B_1$ (or ($\omega_1/\gamma$)) by means of a 180° phase shift in the spin locking pulse; if this phase reversal is performed exactly half-way through the spin locking pulse, the reversal of the spin nutation about the resultant of $\omega_1$ and $\Delta\omega_Q$ regenerates the original signal (that is, refocusses the magnetization) at the end of the spin locking sequence (apart from any change due to relaxation which, it is believed, would be relatively minor).

FIG. 17(b) illustrate this phase reversal technique. The spin locking pulses shown in FIG. 17(a) (of length t and phase 90°) are replaced in FIG. 17(b) by spin locking pulses split into equal portions of length t/2 and of phase respectively 90° and 270°. In similar fashion to that described previously, subtraction of the free induction decays following cycles A and B respectively removes the spurious ring-down following the end of the spin locking pulse. Again as described previously, the free induction decay following the initial preparation pulse is effectively removed by allowing the spin locking pulse to run for sufficient time for the spurious interfering signals to decay to zero. A pulse length for the spin locking pulse of between 1 and 3 or 4 ms has been found to be effective for the 3.41 MHz transition in RDX.

In order to eliminate spurious signals more effectively, a complete phase cycle can be performed in a fashion analogous to that already described above. This may be, for example, either the two or the four pair cycle mentioned previously.

It can be important that the two spin locking pulse halves are of equal duration and are separated by a phase difference of precisely 180°. Otherwise a splitting of the resonance line may occur. To remove potential errors in the timing and 180° phase shift of the spin locking pulse, it may be advantageous to implement the phase cycle so that there are equal numbers of sequences in which the orders of the phases in the phase reversal are respectively 0°–180° and 180°–0°. Within individual pairs of A and B sequences, in order that like is compared fully with like, the order would remain the same. However, for different pairs the order could be changed. Thus, for example, a complete phase cycle (with either two or four pairs of individual sequences) could be performed with the order being 0°–180°, and then a further similar complete phase cycle could be performed with the order being 180°–0°.

Sequences with merely 0°–180° phase changes have been found to be good at enhancing signals for longer pulses, but as the off-resonance effects are not apparently refocussed they cannot substantially increase bandwidth.

To counter this and other problems, various sub-variants of the phase split pulse variant of the phase-cycling method have been devised. In a first sub-variant, further improvements in sensitivity may be obtained by the insertion of additional odd numbers of actual phase reversals during the spin locking sequence, so that, for example, the spin locking pulse would have phases of the form (0°14 180°–0°–180°) (3 actual reversals) or (0°–180°–0°–180°–0°–180°) (5 actual reversals).

In a second sub-variant, a spin locking pulse of the form (P2A, P2B, P2A, P2C) is employed, where P2B and P2C are typically 180° apart in phase and P2A is typically 90° from both of them, with all elements of the locking sequence being typically of equal lengths. Hence a spin locking pulse of the second sub-variant might have phases of the form (0°–90°–0°–270°), with the preparation pulse having a phase of 90°. The pulse may also have a further repeated element, so that the phases are of the form (0°–90°–0°–270°–0°–270°–0°–90°), as shown in FIG. 17(c) (i). FIGS. 17(c)(i) and (ii) also show that this spin locking pulse would be used in a pair of individual pulse sequences, the members of the pair having preparatory pulses of phase 90 and 270°.

The basic premise of the second sub-variant is to allow for the dephasing which occurs when the r.f pulse is off-resonance. In the rotating frame, the magnetization vector then moves away from the spin locking pulse, so that both parallel and perpendicular components develop; phase switching by 90° represents an attempt to lock both these components for at least part of the spin locking period. A phase shift of 180° is then added to refocus in part those components which have moved seriously away from parallelism with $B_1$ during the first three segments.

The resultant response signal obtained by using the A and B sequences of FIG. 17(c) is asymmetric in the frequency domain, since phase changes are equivalent to changes in frequency. Therefore in an enhancement of the second sub-variant, the A and B sequences are combined with "mirror image" C and D sequences, as shown in FIG. 17(d). The summed responses of the sequences A to D, implemented sequentially, can provide a performance which is symmetrical about the excitation carrier frequency and which has relatively broad bandwidth.

Similar improvements in excitation bandwidth could be obtained by applying discrete changes in frequency between individual pulses. Furthermore, a combination of both phase shifts and frequency changes could produce an even better performance in that the changes in carrier frequency can be made to compensate for the changes in phase, an effect of some importance when long r.f. pulses of narrow bandwidth are necessary; this is explained in detail below in relation to the fourth variant. Also, further improvements could be obtained by using a full phase cycle, as described in relation to the second variant of the first embodiment.

What is claimed is:

1. A method of Nuclear Quadrupole Resonance testing a sample, said method comprising applying excitation to said sample to excite an NQR response signal, said excitation comprising a composite pulse having at least 10 closely spaced pulse elements, and detecting an NQR response signal after application of said composite pulse.

2. A method of Nuclear Quadrupole Resonance testing a sample, comprising applying excitation to said sample to excite an NQR response signal, said excitation comprising a composite pulse having an amplitude modulated carrier, and detecting said NQR response signal after application of the composite pulse, wherein said modulated carrier has an envelope defining a series of spaces of relatively low amplitude interleaved with a series of pulse elements of relatively high amplitude, there being at least 10 pulse elements.

3. A method according to claim 1 or 2, wherein said composite pulse has spaces between consecutive pulse elements of 10 μs or less.

4. A method according to claim 3, wherein said spaces are between 0.25 and 5 μs.

5. A method according to claim 1 or 2, wherein the pulse elements have durations of less than 50 μs.

6. A method according to claim 5, wherein said duration of said pulse elements is between 0.5 and 10 μs.

7. A method according to claim 1 or 2, wherein the ratio of pulse element durations to spaces is greater than 1.

8. A method according to claim 7, wherein said ratio is in the range 1.5 to 10.

9. A method according to claim 1 or 2, wherein each of said pulse elements produces an effective flip angle, wherein said effective flip angle is less than one of 5° and 1°.

10. A method according to claim 1 or 2, wherein said composite pulse comprises one of at least 30, at least 50 and at least 100 pulse elements.

11. A method according to claim 1 or 2, wherein said composite pulse has pulse elements of alternating first and second phases.

12. A method according to claim 11, wherein said first and second phases differ by about 90°.

13. A method according to claim 1 or 2, wherein said composite pulse is an inversion pulse arranged to effect inversion of at least 50 percent of the magnetization detectable on applying NQR excitation to said sample.

14. A method according to claim 13, wherein the inversion pulse effects inversion of at least 80 percent of the detectable magnetization.

15. A method according to claim 13, further comprising applying excitation to the sample subsequent to the inversion pulse and detecting an NQR response signal.

16. A method according to claim 13, comprising applying a pulse sequence, said pulse sequence comprising a first pulse of a first phase and at least one second pulse of a second phase, detecting a first NQR response signal; applying said inversion pulse; re-applying said pulse sequence; detecting a second NQR response signal; and comparing the first and second response signals.

17. A method according to claim 16, wherein said pulse sequence comprises a plurality of regularly spaced second pulses of said second phase.

18. A method according to claim 16, wherein said second phase differs from said first phase by about 90°.

19. A method of Nuclear Quadrupole Resonance testing a sample comprising applying a first composite pulse in accordance with claim 1 or 2 to produce a first flip angle, detecting a first NQR response signal; applying a second composite pulse in accordance with claim 1 or 2 to produce a second flip angle, the difference between the first and second flip angles being about 180°; detecting a second NQR response signal; and comprising the first and second response signals.

20. A method according to claim 19, wherein said first flip angle is about 90°.

21. A method according to claim 19, wherein said second flip angle is about 270°.

22. A method according to claim 19, wherein a plurality of said first and second pulses are applied.

23. A method of Nuclear Quadrupole Resonance testing a sample comprising applying first and second composite pulses in accordance with claim 1 or 2, said pulses separated by a delay sufficient to detect an echo response, and detecting one of a first echo response within a time less than said delay following said second pulse or detecting a second echo response at a time greater than said delay following said second pulse.

24. A method of Nuclear Quadrupole Resonance testing a sample, comprising applying to the sample a composite pulse in accordance with claim 1 or 2 and detecting an NQR response for a sampling period from a time following termination of the excitation pulse to a time at least equal to $T_2^*$ thereafter, said pulse being arranged to produce a generally constant signal amplitude during said sampling period.

25. A method according to claim 24, wherein the composite pulse is arranged to produce a flip angle of 270°.

26. A method according to claim 1 or 2, further comprising Fourier transforming said NQR response signal and identifying a peak corresponding to given quadrupolar nuclei.

27. A method according to claim 1 or 2, wherein successive pulse elements are substantially contiguous.

28. A method according to claim 1 or 2, wherein the minimum $B_1$ field supplied to said sample and a maximum $B_1$ field is applied to said sample during a pulse element, said minimum $B_1$ being less than half of said maximum $B_1$.

29. A method according to claim 1 or 2, further comprising producing an image of the sample.

30. A method according to claim 1 or 2, wherein the excitation is selected to produce a substantially sinusoidal dependence of the response signal magnitude on flip angle.

31. A method according to claim 1 or 2, wherein a response signal is detected after a period of one of at least 2.5 ms and 4.5 ms following a pulse.

32. A method according to claim 1 or 2, further comprising determining a response characteristic, comparing the response characteristic to a desired characteristic and adjusting said excitation.

* * * * *